United States Patent [19]

Ukita et al.

[11] Patent Number: 5,177,573

[45] Date of Patent: Jan. 5, 1993

[54] SEMICONDUCTOR INTEGRATED CIRCUIT DEVICE

[75] Inventors: Motomu Ukita; Kenji Anami; Tomohisa Wada, all of Hyogo, Japan

[73] Assignee: Mitsubishi Denki Kabushiki Kaisha, Tokyo, Japan

[21] Appl. No.: 665,944

[22] Filed: Mar. 5, 1991

[30] Foreign Application Priority Data

Mar. 9, 1990 [JP] Japan ................................. 2-58815

[51] Int. Cl.⁵ .............................................. G11C 11/40
[52] U.S. Cl. .......................... 365/189.03; 365/189.05; 307/475
[58] Field of Search ................... 357/23.5; 365/189.05

[56] References Cited

U.S. PATENT DOCUMENTS 4,907,203 6/1990 Wada et al. ...................... 365/238.5
5,056,005 10/1991 Kaneko et al. .................. 365/189.05

OTHER PUBLICATIONS

Kohno et al., "A 14-ns 1-Mbit CMOS SRAM with Variable Bit", *IEEE Journal of Solid-State Circuits*, vol. 23, No. 5, (Oct. 1988), pp. 1060-1066.
Wade et al, "A 14-ns 1 Mb CMOS SRAM with Variable Bit Organization", ISSCC Digest of Technical Papers, (Feb. 1988), pp. 252-253 and 393.

*Primary Examiner*—John D. Lee
*Assistant Examiner*—Robert E. Wise
*Attorney, Agent, or Firm*—Lowe, Price, Le Blanc & Becker

[57] ABSTRACT

A semiconductor memory device changeable in word organization has a plurality of input/output terminals and a plurality of input terminals. Each of the plurality of input/output terminals and the plurality of input terminals are connected to an internal circuit via input-/output buffers. These input/output buffers have identical structures and arrangements with identical input-/output capacitance. The output buffer in the input-/output buffer connected to an input terminal is coupled to a predetermined potential. The output buffer in the input/output buffer connected to an input/output terminal is activated by an output driver. The semiconductor memory device is generally set to a 1M word×1 bit organization. This semiconductor memory device may be set to a 256 k word×4 bit organization at the time of testing.

28 Claims, 20 Drawing Sheets (1M x 1 ORGANIZATION)

(256K x 4 ORGANIZATION)

FIG.15 PRIOR ART

| (AT X1) PIN NAME | (AT X4) PIN NAME | | | (AT X4) PIN NAME | (AT X1) PIN NAME |
|---|---|---|---|---|---|
| A | A | 1 | 28 | Vcc | Vcc |
| A | A | 2 | 27 | A | A |
| A | A | 3 | 26 | A | A |
| A | A | 4 | 25 | A | A |
| A | A | 5 | 24 | A | A |
| A | A | 6 | 23 | A | A |
| NC | NC | 7 | 22 | A | A |
| A | A | 8 | 21 | B1/$\overline{B4}$ | B1/$\overline{B4}$ |
| A | A | 9 | 20 | A | A |
| A | A | 10 | 19 | DQ | A |
| A | A | 11 | 18 | DQ | A |
| Q | A | 12 | 17 | DQ | A |
| $\overline{W}$ | $\overline{CS}$ | 13 | 16 | DQ | D |
| Vss | Vss | 14 | 15 | $\overline{W}$ | $\overline{CS}$ |

( 1M x 1, 256K x 4 BOTH ORGANIZATION )

SEMICONDUCTOR INTEGRATED CIRCUIT DEVICE

BACKGROUND OF THE INVENTION

1. Field of the Invention

The invention relates generally to semiconductor integrated circuit devices, and more particularly, to a semiconductor integrated circuit device comprising external terminals.

2. Description of the Background Art

FIGS. 13 and 14 are examples showing the pin arrangements of static RAMs (Random Access Memory) of a 1M word×1 bit organization and a 256K word×4 bit organization mounted on packages.

In the static RAM of FIG. 13, pins 1-6, pins 8-11, pins 17-20, pins 22-27 are address input terminals having an address signal A applied, and pin 12 is a data output terminal providing data Q. Pin 13 is a read/write control terminal having a read/write control signal $\overline{W}$ applied. The read/write control signal $\overline{W}$ indicates writing in the "L" level, and reading in the "H" level. Pin 14 is a ground terminal having a ground potential of Vss (generally 0 V) applied, and pin 15 is a chip select terminal having a chip select signal $\overline{CS}$ applied. The chip select signal $\overline{CS}$ indicates a selected state in the "L" level, and a non-selected state or a stand-by state in the "H" level. Pin 16 is a data input terminal for the input of data D. Pin 28 is a power supply terminal having a power supply potential of Vcc (generally 5 V) applied. Pins 7 and 21 are unconnected terminals.

In the static RAM of the FIG. 14, pin 12 is an address signal input terminal, pin 13 is a chip select terminal, pin 15 is a read/write control terminal, and pins 16-19 are data input/output terminals for the input/output of data. The other pins are similar to those of the static RAM of FIG. 13.

In conventional static RAMs, devices with different word organizations such as 1M word×1 bit or 256K word×4 bit have different pin arrangements as shown in FIGS. 13 and 14.

The testing of the aforementioned RAMs is considered. The address of 256k is necessary for selecting all the addresses at the time of the testing of the 256k word×4 bit organization RAM. At the time of the testing of the 1M word×1 bit organization RAM, the addresses of 1M is required to select all the addresses. When the conventional so-called N pattern such as march and checker board test patterns are used, the testing time of a 1M word×1 bit organization RAM is four times longer than that of a 256K word×4 bit organization RAM. When the $N^2$ pattern such as galloping test patterns are used, the testing time will be 16 times longer. It is appreciated that even when the RAM of the 1M word×1 bit organization and the RAM of the 256K word×4 bit organization each have the same memory capacity of 1M bit, the testing time differs due to the difference in word organization.

A semiconductor memory device capable of switching the word organization for reducing the testing time is described in Japanese Patent Laying-Open No. 1-134790 (a corresponding U.S. Pat. No. 4,907,203). This semiconductor memory device is switched to a 1M word×1 bit organization RAM during general use, and to a 256K×4 bit organization RAM during testing, by externally applied control signals.

Referring to FIGS. 15-25, this semiconductor memory device will be described.

FIG. 15 is a diagram showing the pin arrangement of a semiconductor memory device mounted on a package capable of switching the word organization.

Pins 1-6, pins 8-11, pin 20, and pins 22-27 have an address signal A applied at the time of both the 1M word×1 bit organization (hereinafter referred to as ×1 organization) and the 256K word×4 bit organization (hereinafter referred to as ×4 organization). Pin 14 has ground potential Vss (generally 0 V) applied at the time of ×1 organization and also at the ×4 organization, while pin 28 has a power supply potential Vcc (generally 5 V) applied at the time of both the ×1 organization and ×4 organization. Pin 12 outputs data Q at the time of ×1 organization, and has an address signal A applied during ×4 organization. Pin 13 has a read/write control signal $\overline{W}$ applied at the time of ×1 organization, while a chip select signal $\overline{CS}$ is applied at the time of ×4 organization. Pin 15 has a chip select signal $\overline{CS}$ applied at the time of ×1 organization, while a read/write control signal $\overline{W}$ is applied at the time of ×4 organization. Pin 16 has data D applied at the time of ×1 organization, while data D is applied or data Q is outputted at the time of ×4 organization. Pins 17-19 have an address signal A applied at the time of ×1 organization, while data D is applied or data Q outputted at the time of ×4 organization. Pin 21 has a switching signal B1/$\overline{B4}$ applied at the time of both the ×1 organization and ×4 organization.

In this semiconductor memory device, the function of each pin is switched so that the ×4 organization is set when the switching signal B1/$\overline{B4}$ is at the "L" level, and the ×1 organization set when the switching signal B1/$\overline{B4}$ is at the "H" level.

This semiconductor memory device has the circuit described later, which is formed on one semiconductor chip where a plurality of pads are connected to pins 1-28 of the package of FIG. 15 by bonding wire on the semiconductor chip.

FIGS. 16 and 17 are block diagrams showing the means for switching the functions of pins 12, 13, 15, 16 and pins 17-19.

In FIGS. 16 and 17, pads 12p, 13p, 15p-19p are connected to pins 12, 13, 15-19 of FIG. 1, respectively.

When the switching signal B1/$\overline{B4}$ is at the "L" level, an address signal A applied to pad 12p is transmitted to the internal circuit via an address input buffer 61. When the switching signal B1/$\overline{B4}$ is at the "H" level, data Q applied from the internal circuit is transmitted to pad 12p via a data output buffer 62.

When the switching signal B1/$\overline{B4}$ is at the "L" level, the chip select signal $\overline{CS}$ applied to pad 13p is applied to a CS buffer 64 via an input first stage 63, to be further transferred to the internal circuit. At this time, the read/write control signal $\overline{W}$ applied to pad 15p is provided to a WE buffer 65 via input first stage 63 to be further transferred to the internal circuit. On the contrary, when the switching signal B1/$\overline{B4}$ is at the "H" level, the read/write control signal $\overline{W}$ applied to pad 13p is transferred to the internal circuit via input first stage 63 and WE buffer 65, while the chip select signal $\overline{CS}$ applied to pad 15p is transferred to the internal circuit via input first stage 63 and CS buffer 64.

Furthermore, when the switching signal B1/$\overline{B4}$ is at the "L" level, data D applied to pad 16p is either transferred to the internal circuit via a data input buffer 66 for ×4 organization, or data Q applied from the internal circuit is transferred to pad 16p via data output buffer 62. When the switching signal $B1/\overline{B4}$ is at the "H" level, data D applied to pad 16b is transferred to the internal circuit via a data input buffer 67 for ×1 organization.

When the switching signal $B1/\overline{B4}$ is at the "L" level, data D applied to pad 17p is either transferred to the internal circuit via data input buffer 66, or data Q applied from the internal circuit is transferred to pad 17p via data output buffer 62. When the switching signal $B1/\overline{B4}$ is at the "H" level, the address signal A applied to pad 17p is transferred to the internal circuit via address input buffer 61.

The circuit connected to pads 18p and 19p is likewise to the circuit connected to pad 17p.

Circuit diagrams of each portion of the semiconductor memory device is shown more specifically in FIGS. 18-25. In these diagrams, N51-N78 indicate n channel transistors, while P51-P81 indicate p channel transistors.

FIG. 18 is a circuit diagram of the address input buffer 61 shown in FIGS. 16 and 17.

First and second control signals E, $\overline{E}$ are complementary signals, and coupled to the switching signal $B1/\overline{B4}$ and the inverted switching signal $B4/\overline{B1}$, respectively. The address input buffer 61 is activated when the first control signal E is at the "H" level, and inactivated when the first control signal E is at the "L" level.

When the first control signal E is at the "L" level and the second control signal $\overline{E}$ is at the "H" level, transistors N51, P51 are turned off while transistor P52 is turned on. This causes a signal of the "H" level to be applied to one input terminal of a NOR circuit 68. Therefore, the output of NOR circuit 68 is fixed to the "L" level. As a result, the output of NOR circuit 68 is not affected by the address signal A applied to the other input terminal. At this time, since transistors N52 and P54 are turned off, node a connected to the internal circuit is brought to a floating state.

A chip select signal $\overline{CS1}$ is generated in the chip in response to a chip select signal $\overline{CS}$ applied externally.

FIG. 19 is a circuit diagram of the input first stage 63 of FIG. 16.

The first and second select signals $E1/\overline{E2}$ and $E2/\overline{E1}$ are signals complementary to each other and coupled to the switching signal $B1/\overline{B4}$ and the inverted switching signal $B4/\overline{B1}$, respectively.

When the first select signal $E1/\overline{E2}$ is at the "H" level, transistors N56 and P58 are turned on, while transistors N54 and P56 are turned off. This causes the inverted signal of the output of NOR circuit 69 to be provided to node b, whereby node c is brought to a floating state. When the first select signal $E1/\overline{E2}$ is at the "L" level, node b is brought to a floating state, and the inverted signal of the output from NOR circuit 69 is provided to node c. Accordingly, the inverted signal of the output from NOR circuit 69 is provided to node b or node c in response to the first and second select signals $E1/\overline{E2}$, $E2/\overline{E1}$.

A chip select signal $\overline{CS}$ or a read/write control signal $\overline{W}$ is applied to one input terminal of NOR circuit 69, while a signal provided internally of the chip such as chip select signal CS1 or a fixed potential is applied to the other input terminal of NOR circuit 69.

FIG. 20 is a block diagram of a data input buffer 66 for ×4 organization shown in FIGS. 16 and 17.

The data input buffer 66 for ×4 organization is activated only when the switching signal $B1/\overline{B4}$ is at the "L" level.

The switching signal $B1/\overline{B4}$ and the inverted switching signal $\overline{B1/B4}$ are signals complementary to each other. When the switching signal $B1/\overline{B4}$ is at the "H" level and the inverted switching signal $\overline{B1/B4}$ is at the "L" level, transistors N58, P59 and N59, P62 are turned off, while transistor P60 is turned on. Accordingly, the output of NOR circuit 70 is fixed to the "L" level, and the buffer output WD from node d is brought to a floating state.

On the contrary, when the switching signal $B1/\overline{B4}$ is at the "L" level, and the inverted switching signal $\overline{B1/B4}$ is at the "H" level, transistors N58, P59 and N59, P62 are turned on, while transistor P60 is turned off. This causes the output of NOR circuit 70 to change in response to the change of data D, with the buffer output WD following.

Four data input buffers 66 for ×4 organization are provided in the chip to obtain four buffer outputs WD at the time of ×4 organization.

FIG. 21 is a block diagram of a data input buffer 67 for ×1 organization shown in FIG. 16.

The data input buffer 67 for ×1 organization is different from the data input buffer 66 for ×4 organization in that the switching signal $B1/\overline{B4}$ and the inverted switching signal $\overline{B1/B4}$ are connected in an opposite manner, with four buffer outputs WD1, WD2, WD3, and WD4 obtained at nodes e, f, g, and h, respectively, from the output of inverter 45. The data input buffer 67 for ×1 organization activates when the switching signal $B1/\overline{B4}$ is at the "H" level (at the time of ×1 organization).

FIG. 22 is a circuit diagram of the data output buffer 62 shown in FIGS. 16 and 17.

When the output buffer control signal OE is at the "L" level, the output of an NAND circuit 78 is at the "H" level and the output of a NOR circuit 77 is at the "L" level. This turns transistor N70, P73 off. Consequently, node i is brought to a floating state, that is, a high impedance state.

On the contrary, when the output buffer control signal OE is at the "H" level, data RDA applied from a memory cell is inverted by NAND circuit 78 and NOR circuit 77 to be transferred to the gates of transistors P73, N70. This causes the output from node i to vary in response to data RDA.

The data output buffers 62 for ×1 organization and ×4 organization both have the same circuit structure. At the time of ×1 organization, an output buffer control signal OE of the "H" level is applied to the ×1 organization output buffer 62, and an output buffer control signal OE of the "L" level is applied to the ×4 organization data output buffer 62. At the time of ×4 organization, the output buffer control signal OE of the reversed levels are applied. Thus, the activation of the data output buffer 62 can be switched between ×1 organization and ×4 organization.

FIG. 23 is a block diagram showing the internal circuit of the semiconductor memory device. A memory cell array 80 includes a plurality of memory cells arranged in a plurality of rows and columns. A row decoder 79 selects one row of memory cell array 80 in response to a plurality of address signals RA applied via a plurality of address input buffers. A column decoder 81 selects four columns of memory cell array 80 in response to a plurality of address signals CA applied via a plurality of address input buffers.

At the time of reading, data is read out from the four memory cells selected by row decoder 79 and column decoder 81. The four sense amplifiers 82 senses and amplifies these data and applies them to a signal switching circuit 84 via read data buses RD1-RD4. The signal switching circuit 84 switches the connection of the read data bus between the ×4 organization and the ×1 organization in response to the switching signal B1/$\overline{B4}$ and the inverted switching signal B4/$\overline{B1}$.

At the time of ×4 organization, the four data readout in read data buses RD1-RD4 are applied to a data output buffer 85 for ×4 organization via read data buses RDA1-RDA4. At the time of ×1 organization, one of the data of the read data buses RD1-RD4 is applied to the data output buffer 86 for ×1 organization via read data bus RDA in response to select signals $\overline{IOS1}$-$\overline{IOS4}$. The select signals $\overline{IOS1}$-$\overline{IOS4}$ are generated from two bits of the address signal A.

At the time of writing, data is applied to four data input buffers 87, or to one data input buffer 89. At the time of ×4 organization, the data applied to four data input buffers 87 are provided to four writing circuits 83 via writing data buses WD1-WD4, respectively. These data are written into four memory cells selected by row decoder 79 and column decoder 81.

At the time of ×1 organization, the data applied to data input buffer 89 is applied to four writing circuits 83 via four writing data buses WD1-WD4. One data among the four is selected by two bits of the address signal A. This data is written into a memory cell selected by row decoder 79 and column decoder 81.

FIG. 24 is a circuit diagram showing the structure of the signal switching circuit 84 of FIG. 23.

Transistors N71-N78 and transistors P74-P81 form eight transfer gates T1-T8.

When the switching signal B1/$\overline{B4}$ at the "L" level, and the inverted switching signal B4/$\overline{B1}$ is at the "H" level, the transfer gates T1-T4 are turned on. Also, the outputs of NOR circuit 90 are brought to the "L" level to turn transfer gates T5-T8 off. Thus, read data buses RD1-RD4 are connected to read data buses RDA1-RDA4 via transfer gates T1-T4, respectively.

On the contrary, when the switching signal B1/$\overline{B4}$ is at the "H" level, and the inverted switching signal B4/$\overline{B1}$ is at the "L" level, transfer gates T1-T4 are turned off. Also, one output of NOR circuit 90 is brought to the "H" level in response to select signals $\overline{IOS1}$-$\overline{IOS2}$. This turns one of the transfer gates T5-T8 on. As a result, one of the read data buses RD1-RD4 is connected to the read data bus RDA via a transfer gate.

FIG. 25 is a diagram showing an example of a switching signal generating circuit.

The switching signal B1/$\overline{B4}$ applied to pad 21p is inverted to become an inverted switching signal B4/$\overline{B1}$ by an inverter 92. This is further inverted by inverter 93 to become a switching signal B1/$\overline{B4}$.

Using this circuit, it is possible to change the word organization by the signal externally applied to pin 21.

In the semiconductor memory device of FIG. 15, pins 1-11 and pins 20-27 each have a single function, while pin 12, pin 13 and pins 15-19 have a plurality of functions. Pins with such multiplexed functions have a plurality of circuits connected to the corresponding pads, as shown in FIGS. 16 and 17. Therefore, there is a difference in input capacitance between pins having multiplexed functions and pins having only one function.

For example, the input capacitance of pin 19 having an address signal A applied at the time of ×1 organization is different from that of pin 20 having an address signal A applied. This means that the transfer speed of the address signal A applied to pin 19 differs from the transfer speed of the address signal A applied to pin 20. Since the access time of the semiconductor memory device is determined by the address signal A having a slow transfer speed, the access time during ×1 organization and the access time during ×4 organization will differ.

Thus, by changing the word organization, the characteristic of the semiconductor memory device will change. For example, in the case the semiconductor memory device is tested under the state of ×4 organization for the purpose of reducing the testing time, the testing result will differ from that of the semiconductor memory device under the state of the ×1 organization. Consequently, a correct testing result can not be obtained.

Also, since the input capacitance of each pin varies, the stray capacitance of the signal wiring on the board will differ when the semiconductor memory device is packaged on the board. This generates speed differences in the signals on the board, that is to say, skew occurs. While skew is generated, it is necessary to substantially lower the operating speed of the system and increase the operating cycle, which becomes the cause of lowering the performance of the system.

SUMMARY OF THE INVENTION

An object of the present invention is to obtain a semiconductor integrated circuit device without variations in the input capacitance of the pins.

Another object of the invention is to obtain a semiconductor memory device with changeable word organization by signals applied to external pins, and without variations in the input/output capacitance by the pins.

A still further object of the invention is to eliminate variations in the input/output capacitance dependent upon the pin, in a semiconductor memory device selectively operable between a word organization for a particular circuit application and the other word organization for testing.

The semiconductor integrated circuit device in accordance with the present invention comprises a plurality of terminals, a plurality of input/output buffers, and an internal circuit. The plurality of terminals comprise first terminals used both signal input and signal output and second terminals used only for signal input. The plurality of input/output buffers are each connected to a respective one of the first and second terminals and have the same input capacitance. Each of the plurality of input/output buffers comprises an input buffer and an output buffer. The internal circuit is coupled to the plurality of input/output buffers and performs a predetermined signal processing.

The semiconductor integrated circuit device according to another aspect of the invention comprises a plurality of terminals, a plurality of input/output buffers, and an internal circuit. The plurality of terminals comprise first terminals used for both signal input and signal output and second terminals used only for signal output. The plurality of input/output buffers are each connected to a respective one of the first and second terminals and have the same output capacitance. Each of the plurality of input/output buffers comprises an input buffer and an output buffer. The internal circuit is coupled to the plurality of input/output buffers and performs a predetermined signal processing.

Since a plurality of terminals are coupled to the internal circuit means via input/output buffers having the same input/output capacitance in the semiconductor integrated circuit device, there is no variation in the input/output capacitance by the terminals. Therefore, the transfer speed of the signals applied to each terminal is identical.

When this semiconductor integrated circuit device is packaged on a board, the stray capacitance of the signal wiring on the board will also become identical. Accordingly, skew will not be generated in the signals on the board.

The semiconductor integrated circuit device according to another aspect of the invention comprises a semiconductor chip, a plurality of memory cells formed on the semiconductor chip, a plurality of terminals formed on the semiconductor chip for receiving data and address signals, a plurality of input/output buffers formed on the semiconductor chip, a first processor, a second processor, a switching signal generator, and a signal switching device.

The plurality of input/output buffers are connected to the plurality of terminals, respectively, and have the same input/output capacitance. The input/output buffer comprises an input buffer and an output buffer.

The first processor is connected to a predetermined input/output buffer of the plurality of input/output buffers. The first processor comprises a first number of address input portions for receiving an address signal via some of the plurality of terminals and the corresponding input/output buffers thereof, and a second number of data receiving portions for receiving data, to select a second number of memory cells from the plurality of memory cells in response to the address signal applied to the address input portion, and either writes the data applied to the data receiving portion into the selected memory cell, or reads out the data stored in the selected memory cell to the data receiving portion.

The second processor is coupled to a predetermined input/output buffer of the plurality of input/output buffers. The second processor comprises a third number of address input portions for receiving the address signal via some of the plurality of terminals and the corresponding input/output buffers thereof, and a fourth number of data receiving portions for receiving data, to select the fourth number of memory cells of the plurality of memory cells in response to the address signal applied to the address input portion, and either writes the data applied to the data receiving portion into the selected memory cell, or reads out the data stored in the selected memory cell to the data receiving portion.

The switching signal generator generates switching signals. The signal switching device couples the address input portion and the data receiving portion of the first processor to the predetermined terminals of the plurality of terminals via the corresponding input/output buffers thereof in response to a first state of the switching signal generated by the switching signal generator, and couples the address input portion and the data receiving portions of the second processor to a predetermined terminals of the plurality of terminals via the corresponding input/output buffers in response to a second state of the switching signal generated by the switching signal generator.

Since a plurality of terminals are coupled to a first processing means or a second processing means via input/output buffers having the same input/output capacitance in this semiconductor integrated circuit device, variations in input/output capacitance by terminals will not occur. Accordingly, the transfer speed of the signals applied to the terminals will be the same.

Also, when this semiconductor integrated circuit device is packaged on the board, the stray capacitance of the signal wiring on the board will be the same. Accordingly, skew will not occur in the signals on the board.

As a result, the word organization is changeable and correct testing results may be obtained in a short time.

In addition, it is easy for users to use the semiconductor integrated circuit device because the capacitance at each pin is the same irrespective of word organization.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a diagram showing the pin arrangements of a conventional semiconductor memory device with changeable word organization.

DESCRIPTION OF THE PREFERRED EMBODIMENTS

The embodiments of the present invention will be described in detail with reference to the figures.

Figure 1A:
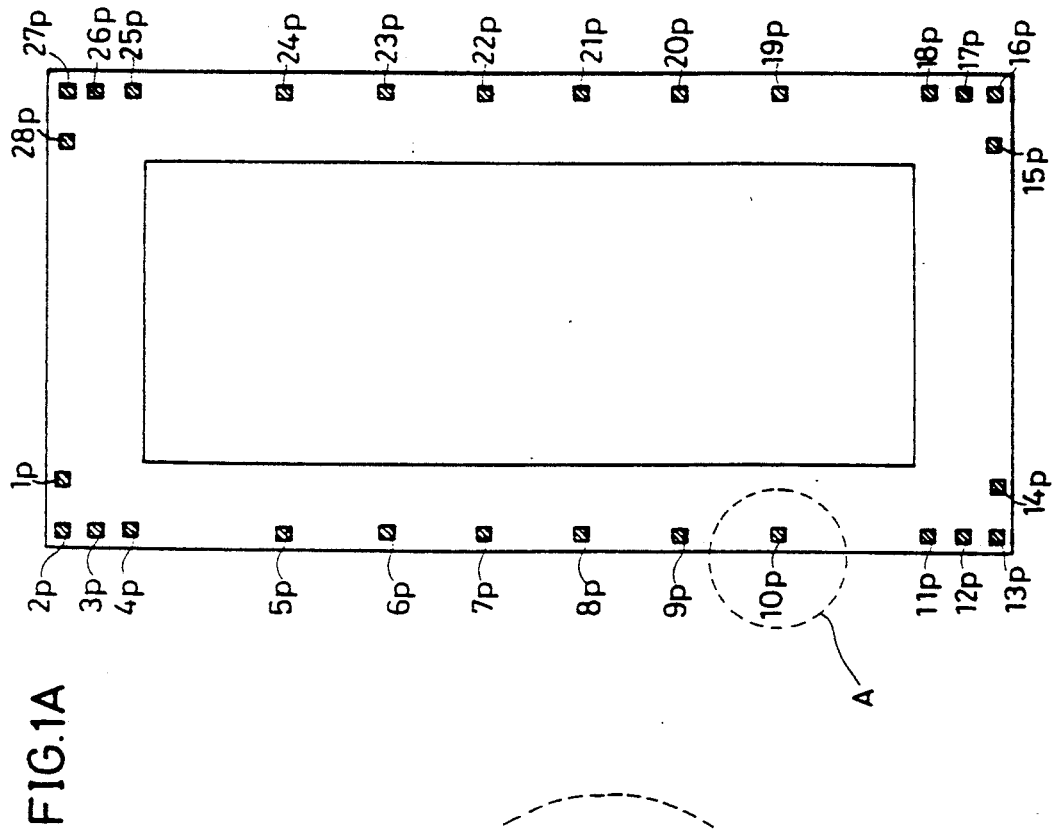
FIG. 1A is a diagram of a semiconductor chip included in the semiconductor memory device in accordance with an embodiment of the present invention.
Figure 1B:
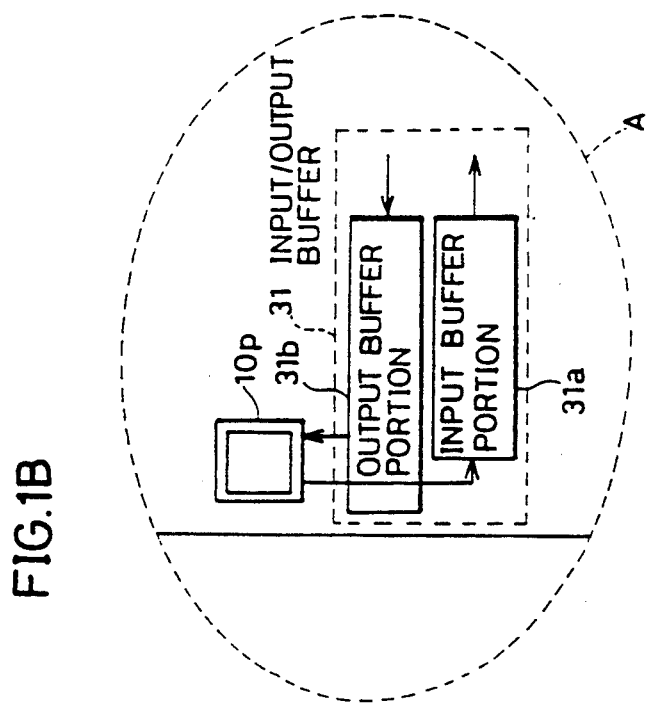
FIG. 1B is an enlarged diagram of the pads and its peripheries formed on the semiconductor chip of FIGS. 1B and 1A.

FIG. 1A shows a semiconductor chip included in the semiconductor memory device in accordance with one embodiment of the invention, while FIG. 1B shows the pads formed on the semiconductor chip of FIG. 1A and its periphery in detail.

This semiconductor memory device is changeable between a 1M word×1 bit organization and a 256K word×4 bit organization.

In FIG. 1A, a plurality of pads 1p-28p are formed on the peripheral portion of the semiconductor chip CH. The plurality of pads 1p-28p are connected to pins 1-28 of the package by bonding wires.

It can be seen from FIG. 1B that an input/output buffer 31 is arranged on one side of pad 10p. The input/output buffer 31 comprises an input buffer portion 31a and an output buffer portion 31b. Input buffer portion 31a and output buffer portion 31b are connected to pad 10p. The structure and arrangements of other pads and input/output buffers are identical to the structure and arrangements of FIG. 1B.

Figure 2:
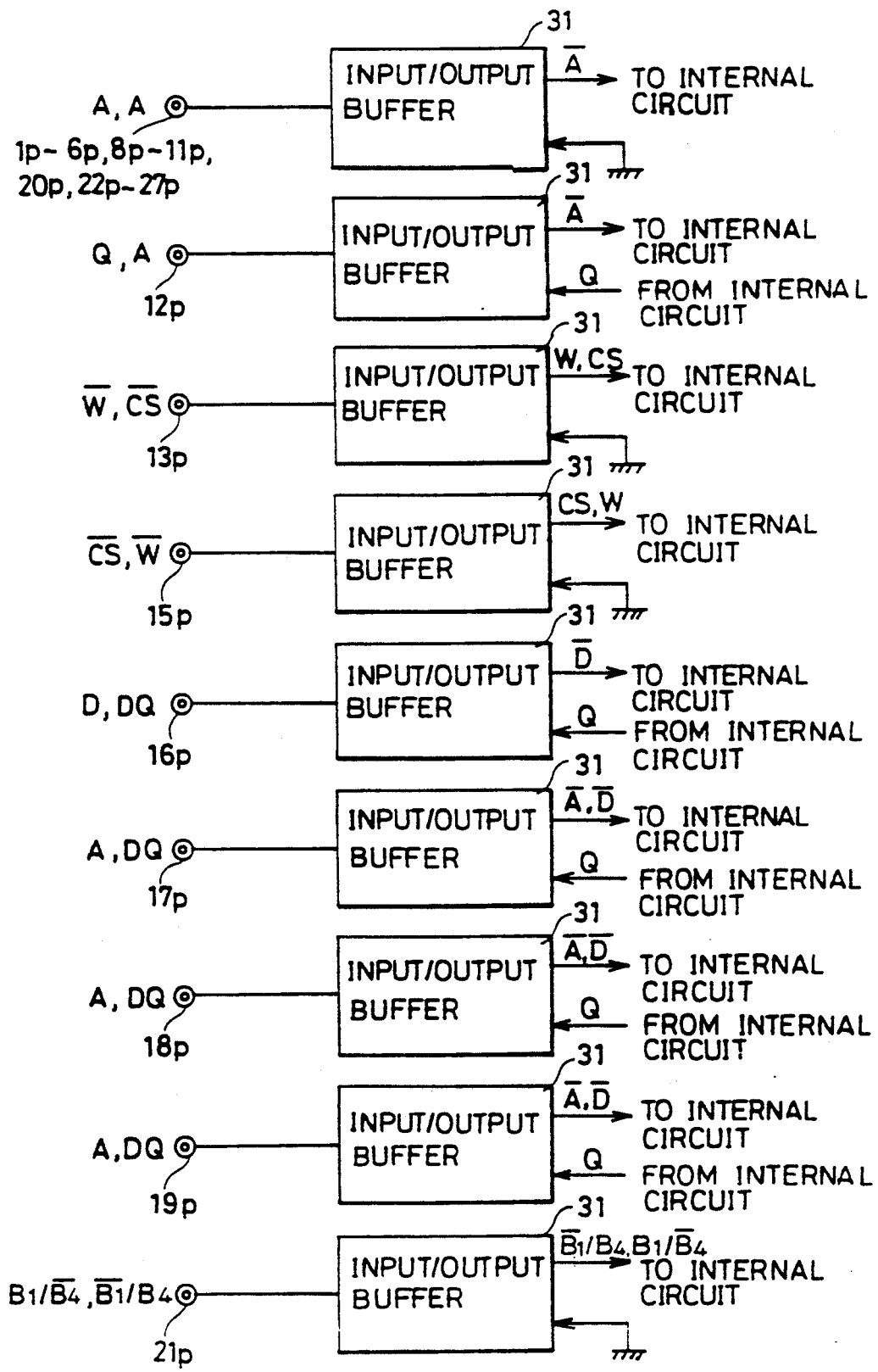
FIG. 2 is a diagram showing the signals applied to each pad and the input/output buffers.

FIG. 2 is a diagram showing the signals applied to each pad and the input/output buffers connected to each pad.

Pads 1p-6p, 8p-11p, 20p, 22p-27p have an address signal A externally applied at the time of both the ×1 organization and the ×4 organization. Pad 12p has data Q provided from the internal circuit at the time of ×1 organization, while an address signal A is externally applied at the time of ×4 organization. Pad 13p has a read/write control signal W⁻ externally applied at the time of ×1 organization, while a chip select signal $\overline{CS}$ is externally applied at the time of ×4 organization. Pad 15p has a chip select signal $\overline{CS}$ externally applied at ×1 organization, while a read/write control signal $\overline{W}$ is externally applied at the time of ×4 organization.

Pad 16p has data D externally applied at the time of ×1 organization, while data D is externally applied or data Q is provided from the internal circuit at the time of ×4 organization. Pads 17p-19p have an address signal A externally applied at the time of ×1 organization, while data D is externally applied or data Q is provided from the internal circuit at the time of ×4 organization. Pad 21p has the switching signal B1/$\overline{B4}$ or the inverted switching signal B1/$\overline{B4}$ externally applied at the time of both the ×1 organization and the ×4 organization.

Each pad has an input/output buffer 31 with identical circuit structure and layout connected. Each input/output buffer 31 comprises an input buffer portion 31a and an output buffer portion 31b as shown in FIG. 1B, to be used as an input buffer, an output buffer, or an input/output buffer depending on the connected pad. Though the input/output buffer 31 connected to pads 1p-6p, 8p-11p, 20p, 22p-27p, the input/output buffer 31 connected to pad 13p, the input/output buffer 31 connected to pad 15p, and the input/output buffer 31 connected to pad 21p are all used as the input buffer, they also comprise the output buffer portion 31p. Therefore, the input/output buffer 31 connected to all the pads have the same input/output capacitance.

Figure 3A:
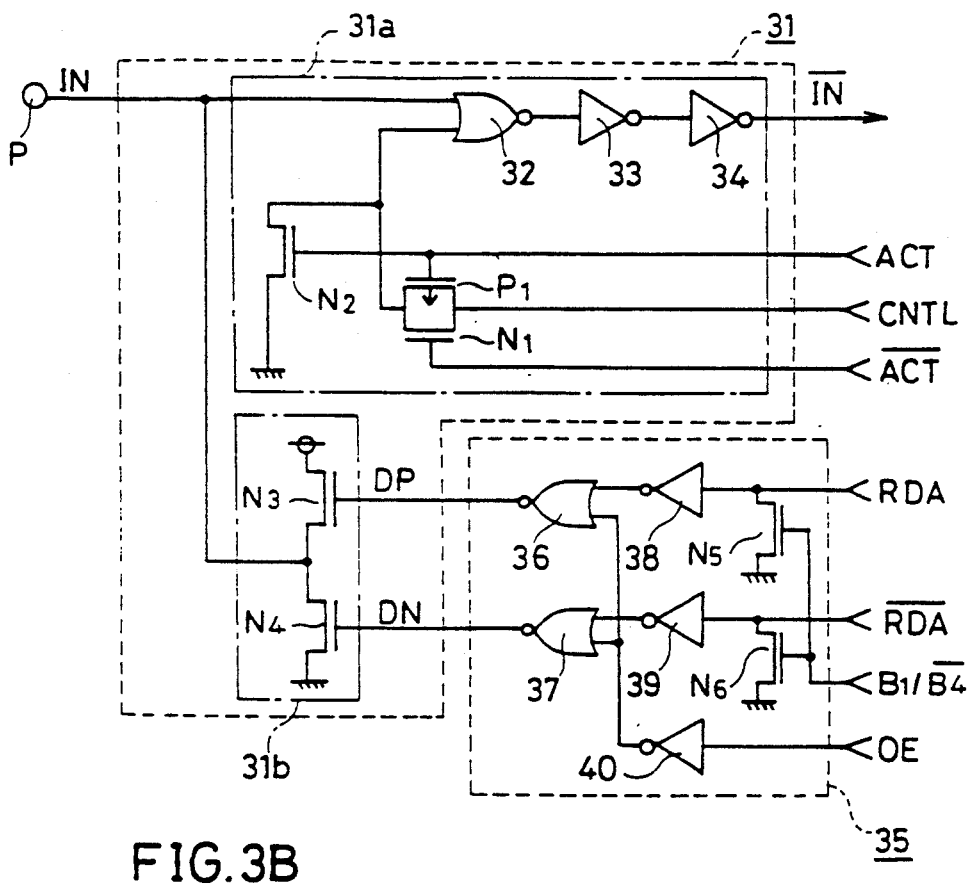
FIG. 3A is a circuit diagram showing an example of the structure of the input/output buffer.

FIG. 3A is a circuit diagram of the input/output buffer 31 of FIG. 2.

The input/output buffer 31 comprises an input buffer portion 31a and an output buffer portion 31b. The input buffer portion 31a comprises a NOR circuit 32, inverters 33 and 34, n channel transistors N1, N2, and a p channel transistor P1. An input signal IN is applied to one input terminal of NOR circuit 32 via pad P, while a control signal CNTL is applied to the other input terminal via a transfer gate formed by transistors N1, P1.

When the activation signal ACT is at the "H" level and the inverted activation signal $\overline{ACT}$ is at the "L" level, transistors P1, N1 are turned off, while transistor N2 is turned on. This causes one input of NOR circuit 32 to be fixed to the "L" level. Accordingly, the output of NOR circuit 32 changes in response to the change of the input signal IN, with the buffer output $\overline{IN}$ following.

On the contrary, when the activation signal ACT is at the "L" level, and the inverted activation signal $\overline{ACT}$ is at the "H" level, transistors P1, N1 are turned on, while transistor N2 is turned off. This causes NOR circuit 32 to provide the result of NOR logic of input signal IN and control signal CNTL. In other words, when control signal CNTL is at the "L" level, the buffer output $\overline{IN}$ is the inverted signal of input signal IN, and when control signal CNTL is at the "H" level, the buffer output $\overline{IN}$ turns to the "L" level.

Thus, activation signal ACT and inverted activation signal $\overline{ACT}$ are used to select whether control signal CNTL is to be transferred or not. Control signal CNTL is used to select whether input signal IN is to be internally transferred or not. In general, activation signal ACT and inverted activation signal $\overline{ACT}$ are fixed to the "H" level or the "L" level in accordance with each pin. For example, activation signal ACT and inverted activation signal e,ovs/ACT/ are fixed to the "H" and the "L" level, respectively, in an input/output buffer 31 for inputting address signal A. Control signal CNTL is used for the purpose of preventing the output data from being transferred to the internal circuit at the time of read out in an input/output buffer 31 used as both the input buffer and the output buffer.

The output buffer portion 31b comprises n channel transistors N3, N4. The outputs DP, DN from output buffer driver 35 are applied to the gates of transistors N3, N4, respectively.

The output buffer driver 35 comprises NOR circuits 36, 37, inverters 38, 39 and 40, and n channel transistors N5, N6.

When the switching signal B1/$\overline{B4}$ is at the "H" level, transistors N5, N6 are turned on. This causes the outputs of inverters 38, 39 to be at the "H" level, regardless of the change in the data signal RDA and inverted data signal $\overline{\text{RDA}}$ applied from the memory cell, to fix the outputs DP, DN of NOR circuits 36, 37 to the "L" level. As a result, the transistors N3, N4 of output buffer portion 31b are turned off, and the buffer output OUT is brought to a floating state.

When the switching signal B1/$\overline{\text{B4}}$ is at the "L" level, transistors N5, N6 are turned off. The causes data signal RDA and inverted data signal $\overline{\text{RDA}}$ to be applied to the input terminals of inverters 38, 39, to be further transferred to NOR circuits 36, 37. If the output control signal OE is at the "H" level at this time, the outputs DN, DP of output buffer driver 35 are turned to the level corresponding to data signal RDA and inverted data signal $\overline{\text{RDA}}$. In this case, outputs DN and DP are signals complementary to each other. Accordingly, one of the transistors N3, N4 of output buffer portion 31b is turned on, while the other is turned off. Therefore, the buffer output OUT turns to either the "H" level or the "L" level in response to data signal RDA, to be provided to pad P.

The control signal CNTL and output control signal OE are generated from the control signal generating circuit described in the following.

Figure 3B:
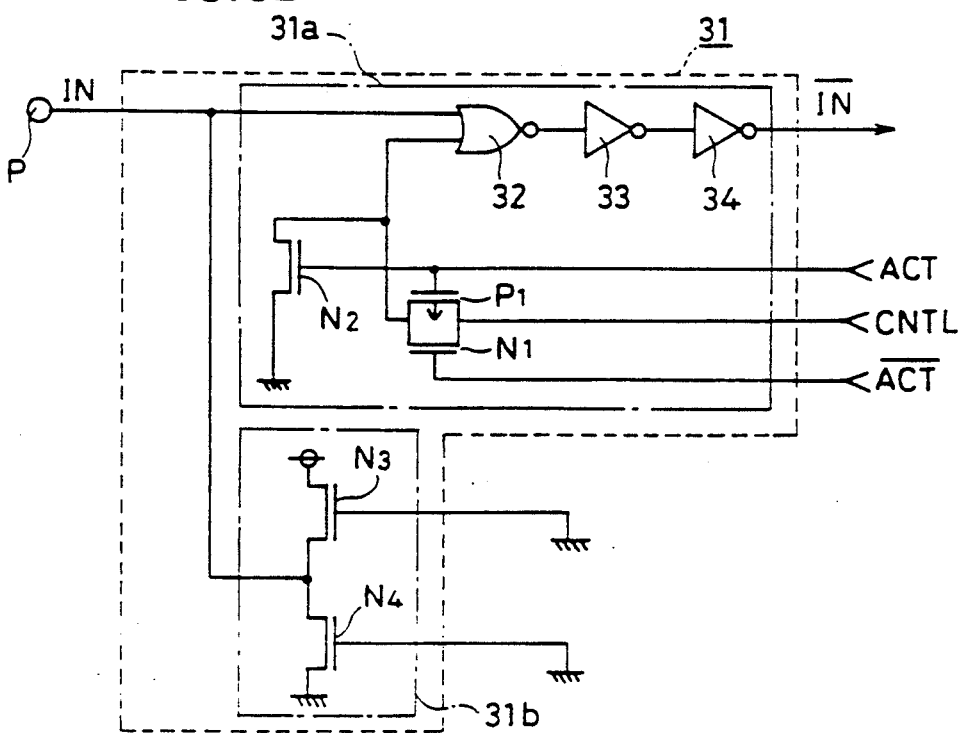
FIG. 3B is a circuit diagram showing the structure of an input/output buffer used only for input of signals.

FIG. 3B shows the structure of an input/output buffer 31 used only for the input of signals. The circuit structure and layout of the input/output buffer 31 shown in FIG. 3B are identical to those of the input/output buffer 31 shown in FIG. 3A, except that the gates of transistors N3, N4 in output buffer portion 31b are connected to ground in the input/output buffer 31 of FIG. 3B. Therefore, the buffer output OUT of output buffer portion 31b is in a floating state.

The output buffer portion 31b in input/output buffer 31 of FIGS. 3A and 3B is formed by transistors of a large size. The output transistor is also used as an input protection circuit with respect to high voltages. Therefore it is not necessary to provide a special exclusive circuit for input protection to each pad as before.

Figure 4:
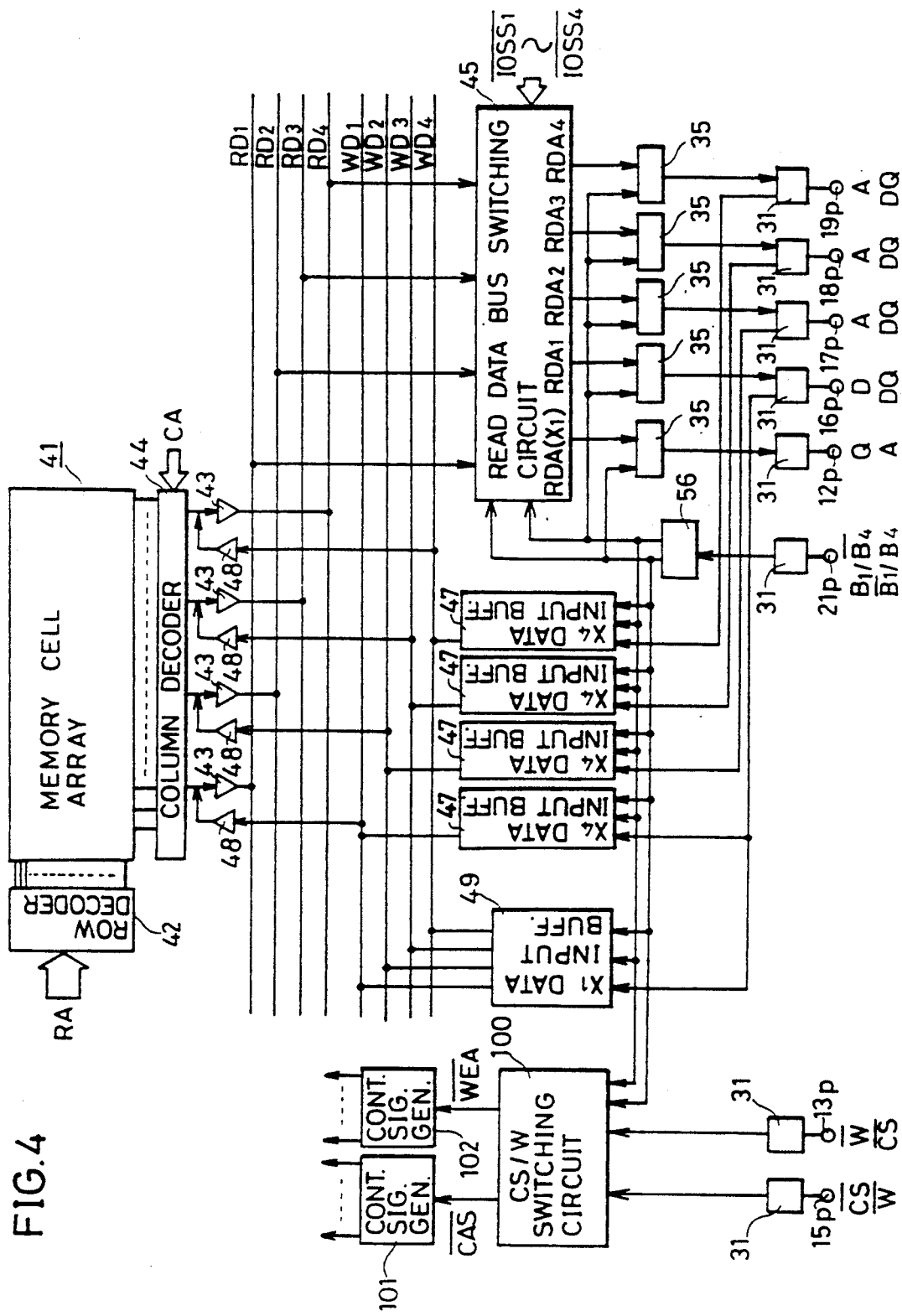
FIG. 4 is a block diagram showing a structure of the internal circuit of the semiconductor memory device of the same embodiment.

FIG. 4 is a block diagram showing a structure of the internal circuit of the semiconductor memory device of this embodiment.

Memory cell array 41 comprises a plurality of memory cells arranged into a plurality of rows and columns. A row decoder 42 selects one row of memory cell array 41 in response to a plurality of address signals RA applied via a plurality of input buffers. A column decoder 44 selects four columns of memory cell array 41 in response to a plurality of address signals CA applied via a plurality of input buffers.

At the time of reading, data is read out from four memory cells selected by row decoder 42 and column decoder 44. Four sense amplifiers 43 sense and amplify these data and provide them to read data bus switching circuit 45 via read data buses RD1-RD4, respectively. The read data bus switching circuit 45 switches the connection of read data bus between ×4 organization and ×1 organization in response to the switching signal B1/$\overline{\text{B4}}$ and the inverted switching signal $\overline{\text{B1/B4}}$.

At the time of ×4 organization, the four data read out into read data buses RD1-RD4 are applied to output driver 35 via read data buses RDA1-RDA4.

At the time of ×1 organization, one data of read data buses RD1-RD4 is applied to ×1 organization output buffer driver 35 via read data bus RDA (×1) in response to select signals $\overline{\text{IOSS1}}$-$\overline{\text{IOSS4}}$. Select signals $\overline{\text{IOSS1}}$-$\overline{\text{ISSO4}}$ are generated from two bits of the address signal.

At the time of writing, data is applied to four input/output buffers 31 via pads 16p-19p, or data is applied to one input/output buffer 31 via pad 12p. At the time of ×4 organization, the four data applied to the four input/output buffers 31 are applied to four writing circuits 48 via four ×4 data input buffers 47 and writing data buses WD1-WD4. These data are written into four memory cells selected by row decoder 42 and column decoder 44.

At the time of ×1 organization, the data applied to input/output buffer 31 is applied to four writing circuits 48 via ×1 data input buffer 49 and four writing data buses WD1-WD4. One data of the four data is selected by two bits of the address signal. This data is written into a memory cell selected by row decoder 42 and column decoder 44.

Pad 13p is connected to a CS/W switching circuit 100 via input/output buffer 31. Pad 15p is connected to CS/W switching circuit 100 via input/output buffer 31. The chip select signal $\overline{\text{CSA}}$ provided from CS/W switching circuit 100 is applied to control signal generating circuit 101. The writing control signal $\overline{\text{WEA}}$ provided from CS/W switching circuit 100 is applied to a control signal generating circuit 102. Control signal generating circuits 101 and 102 generate various control signals controlling respective portions of the semiconductor memory device.

The data readout from the memory cell is transferred to the input/output buffer always with a complementary inverted data signal, though not shown in FIG. 4 for the sake of simplification. Also, the transfer path of address signal A is not shown in FIG. 4.

Figure 5:
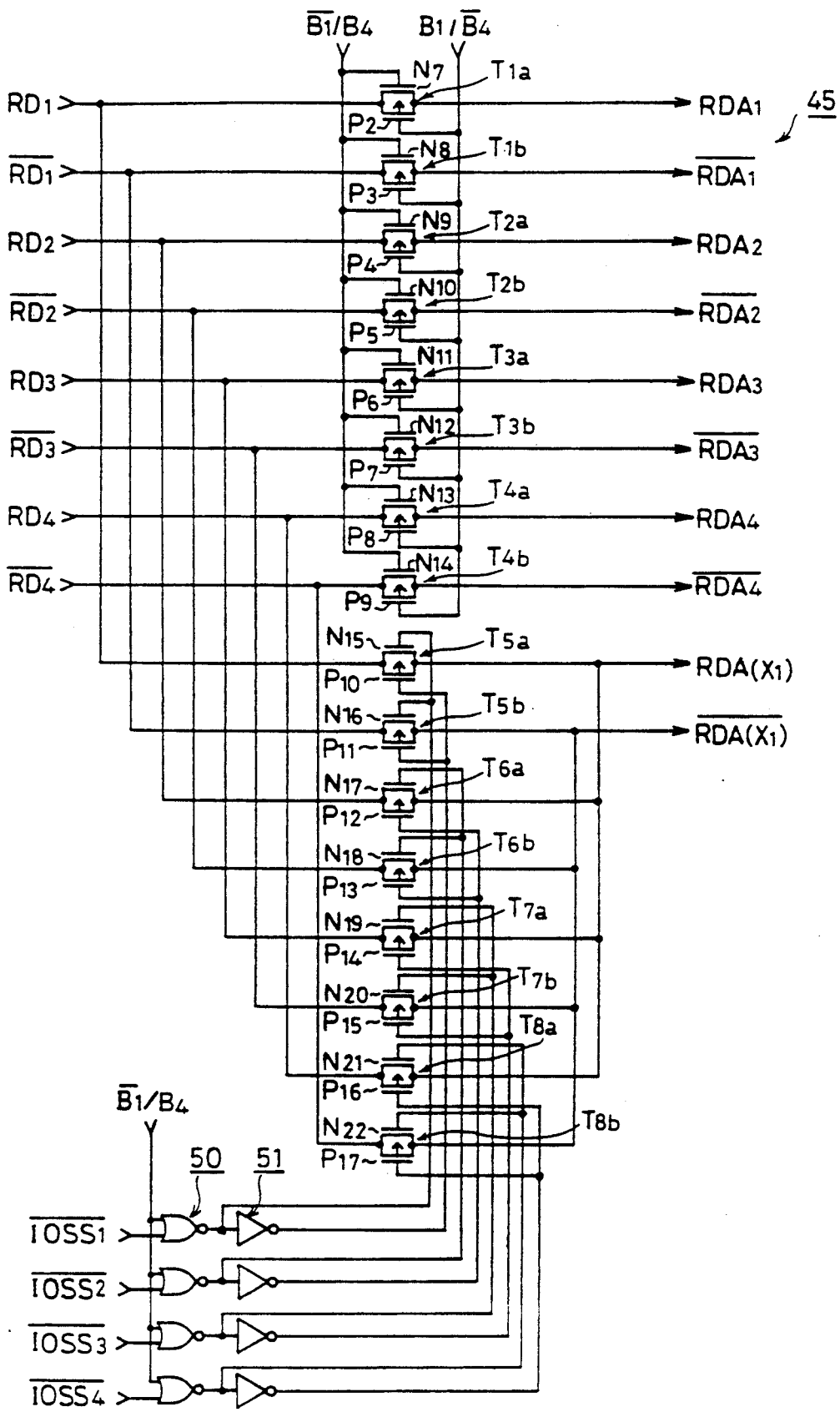
FIG. 5 is a circuit diagram of the read data bus switching circuit of FIG. 4.

FIG. 5 is a circuit diagram showing the structure of a read data bus switching circuit 45 of FIG. 4.

The read data bus switching circuit 45 comprises four NOR circuits 50, four inverters 51, n channel transistors N7-N22, and p channel transistors P2-P17. These transistors N7-N22 and transistors P2-P17 form 16 pairs of transfer gates T1a-T8a, T1b-T8b. The transfer gate marked with "a" pairs with the transfer gate marked with "b", in which the transfer gates forming each pair are conductive or blocked at the same time.

The inverted switching signal $\overline{\text{B1/B4}}$ is commonly applied to one input terminal of the four NOR circuits 50. The select signals $\overline{\text{IOSS1}}$-$\overline{\text{IOSS4}}$ are respectively applied to the other input terminal of the four NOR circuits 50. The read data buses RD1-RD4, $\overline{\text{RD1}}$-$\overline{\text{RD4}}$ are connected to read data buses RDA1-RDA4, RDA1-RDA4 via transfer gates T1a-T4a, T1b-T4b, respectively. Read data buses RD1-RD4, $\overline{\text{RD1}}$-$\overline{\text{RD4}}$ are commonly connected to read data buses RDA (×1), $\overline{\text{RDA}}$ (×1) via transfer gates T5a-T8a, T5b-T8b, respectively. The read data bus marked with a reference numeral including RD pairs with the read data bus marked with the reference numeral including $\overline{\text{RD}}$, while the read data bus marked with a reference numeral including RDA pairs with a read data bus marked with a reference numeral including $\overline{\text{RDA}}$, whereby signals complementary to each other are transferred.

The inverted switching signal $\overline{\text{B1/B4}}$ is applied to one gate of transfer gates T1a-T4a, T1b-T4b, while the switching signal $\overline{\text{B1/B4}}$ is applied to the other gate. The output signal of the four NOR circuits 50 are applied to one gate of transfer gates T5a-T8a, T5b-T8b, while the output signals of the four NOR circuit 50 inverted by inverter 51 are applied to the other gate.

When the switching signal B1/$\overline{\text{B4}}$ is at the "L" level and the inverted switching signal $\overline{\text{B1/B4}}$ is at the "H"

level, transistors N7-N14, P2-P9 are turned on. Since the outputs of NOR circuits 50 are brought to the "L" level, transistors N15-N22, P10-P17 are turned off. Consequently, read data buses RD1-RD4, $\overline{RD1}$-$\overline{RD4}$ are connected to read data buses RDA1-RDA4, $\overline{RDA1}$-$\overline{RDA4}$ via transfer gates T1a-T4a, T1b-T4b, respectively.

On the contrary, when the switching signal B1/$\overline{B4}$ is at the "H" level, and the inverted switching signal $\overline{B1}$/B4 is at the "L" level, transistors N7-N14, P2-P9 are turned off. One output of NOR circuits 50 becomes the "H" level in response to select signals $\overline{IOSS1}$-$\overline{IOSS4}$, to turn one pair of transfer gates T5a-T8a, T5b-T8b on. This causes one pair of the read data buses RD1-RD4, $\overline{RD1}$-$\overline{RD4}$ to be connected to read data bus RDA (×1), $\overline{RDA}$ (×1) via the transfer gate.

Figure 6:
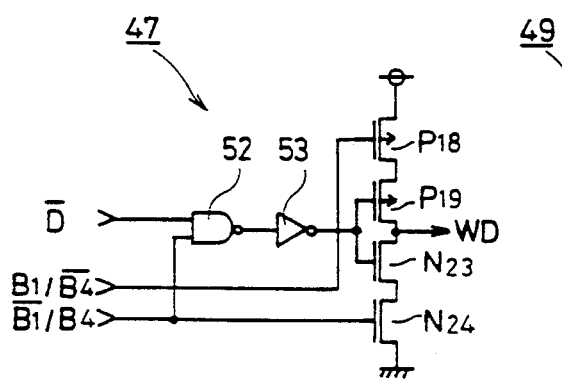
FIG. 6 is a circuit diagram of a ×4 data input buffer of FIG. 4.

FIG. 6 is a circuit diagram of the ×4 data input buffer 47 of FIG. 4.

The ×4 data input buffer 47 comprises n channel transistors N23, N24, p channel transistors P18, P19, NAND circuit 52, and inverter 53. The inverted data D-inverted by the input/output buffer after being input to pad 16p is applied to one input terminal of NAND circuit 52, while the inverted switching signal $\overline{B1}$/B4 is applied to the other input terminal.

When the switching signal B1/$\overline{B4}$ is at the "H" level and the inverted switching signal $\overline{B1}$/B4 is at the "L" level, transistors N24, P28 are turned off. This causes the output of NAND circuit 52 to be fixed to the "H" level, with the buffer output WD turned to a floating state.

On the contrary, when the switching signal B1/$\overline{B4}$ is at the "L" level and the inverted switching signal $\overline{B1}$/B4 is at the "H" level, transistors N24, P18 are turned on. This causes the output of NAND circuit 52 to change in response to data $\overline{D}$, with the buffer output WD following. Thus, the ×4 data input buffer 47 is activated only when the switching signal B1/$\overline{B4}$ is at the "L" level.

Four ×4 data input buffers 47 are provided in the semiconductor chip to obtain four buffer outputs WD at the time of ×4 organization.

Figure 7:
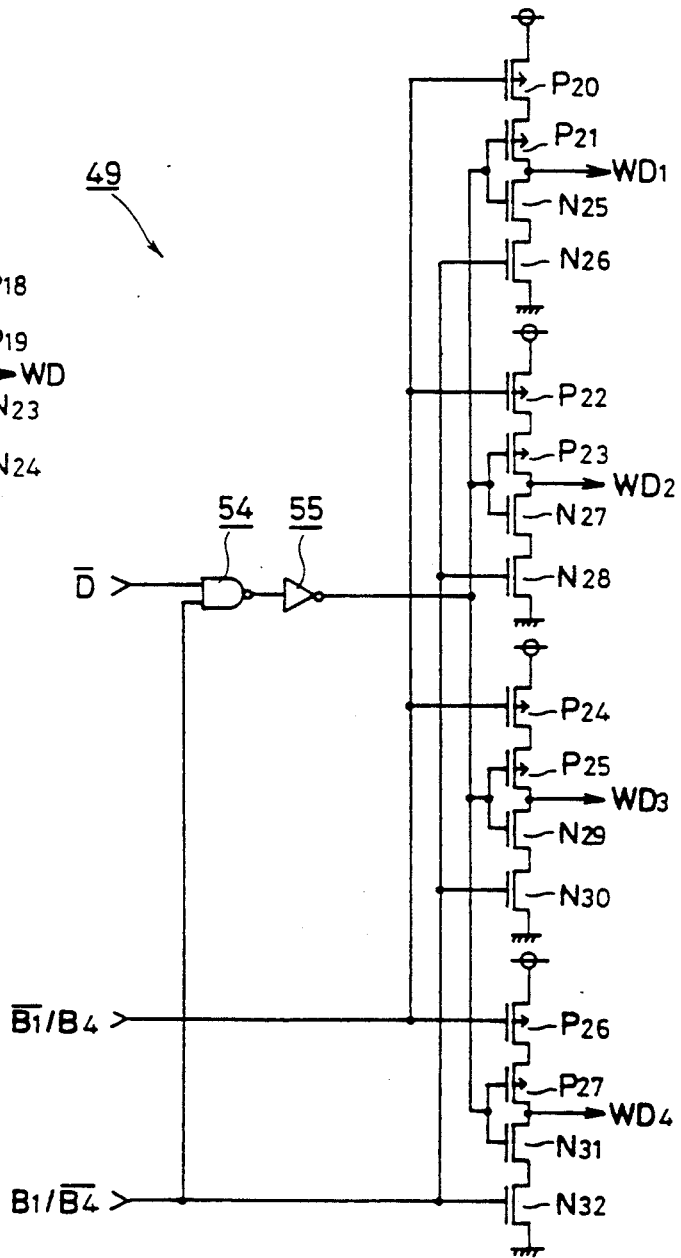
FIG. 7 is a circuit diagram of a ×1 data input buffer of FIG. 4.

FIG. 7 is a circuit diagram of the ×1 data input buffer 49 of FIG. 4.

The ×4 data input buffer 49 comprises a NAND circuit 54, inverter 55, n channel transistors N25-N32, and p channel transistors P20-P27, similar to the ×4 data input buffer 47.

The ×1 data input buffer 49 of FIG. 7 differs from the ×4 data input buffer 47 of FIG. 6 in that the switching signal B1/$\overline{B4}$ and the inverted switching signal $\overline{B1}$/B4 are connected in an opposite manner, and that four buffer outputs WD1, WD2, WD3, and WD4 are obtained from the output of inverter 55. The ×1 data input buffer 49 is activated when the switching signal B1/$\overline{B4}$ is at the "H" level (at the time of ×1 organization).

Figure 8:
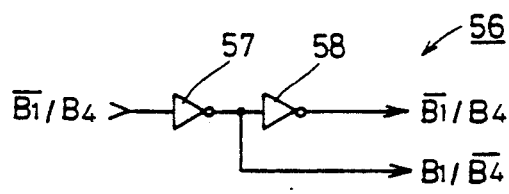
FIG. 8 is a circuit diagram of the switching signal generating circuit of FIG. 4.

FIG. 8 is a circuit diagram showing an example of the structure of the switching signal generating circuit 56 of FIG. 4.

The switching signal generating circuit 56 comprises two inverters 57 and 58. The inverted switching signal $\overline{B1}$/B4 inverted by input/output buffer after being applied from pad 21p (FIG. 4) is re-inverted by inverter 57 to become a switching signal B1/$\overline{B4}$, and further inverted by inverter 58 to become an inverted switching signal $\overline{B1}$/B4. Pad 21p (FIG. 4) is connected to pin 21 on the package by a bonding wire.

Using this circuit, it is possible to change the word organization by the switching signal B1/$\overline{B4}$ externally applied to pin 21.

In the semiconductor memory device in accordance with the embodiment, an input/output buffer having the same circuit structure and layout is connected to all pads, so that the characteristic of the device will not change when the word organization is changed. As a result, the input/output capacitance of all pins are identical.

Also in this embodiment, the transfer path of each signal is formed identically to further reduce the change of the device's characteristic induced by the change in word organization. To be more specific, the number and type of the logic gate through which the signal passes are the same.

For example, the pin where a chip select signal $\overline{CS}$ is applied and the pin where a read/write control signal $\overline{W}$ is applied are interchanged at the time of ×1 organization and ×4 organization. Both of these signals are switched to the desired path to be transferred at the same timing regardless of the ×1 organization and ×4 organization.

Figure 9:
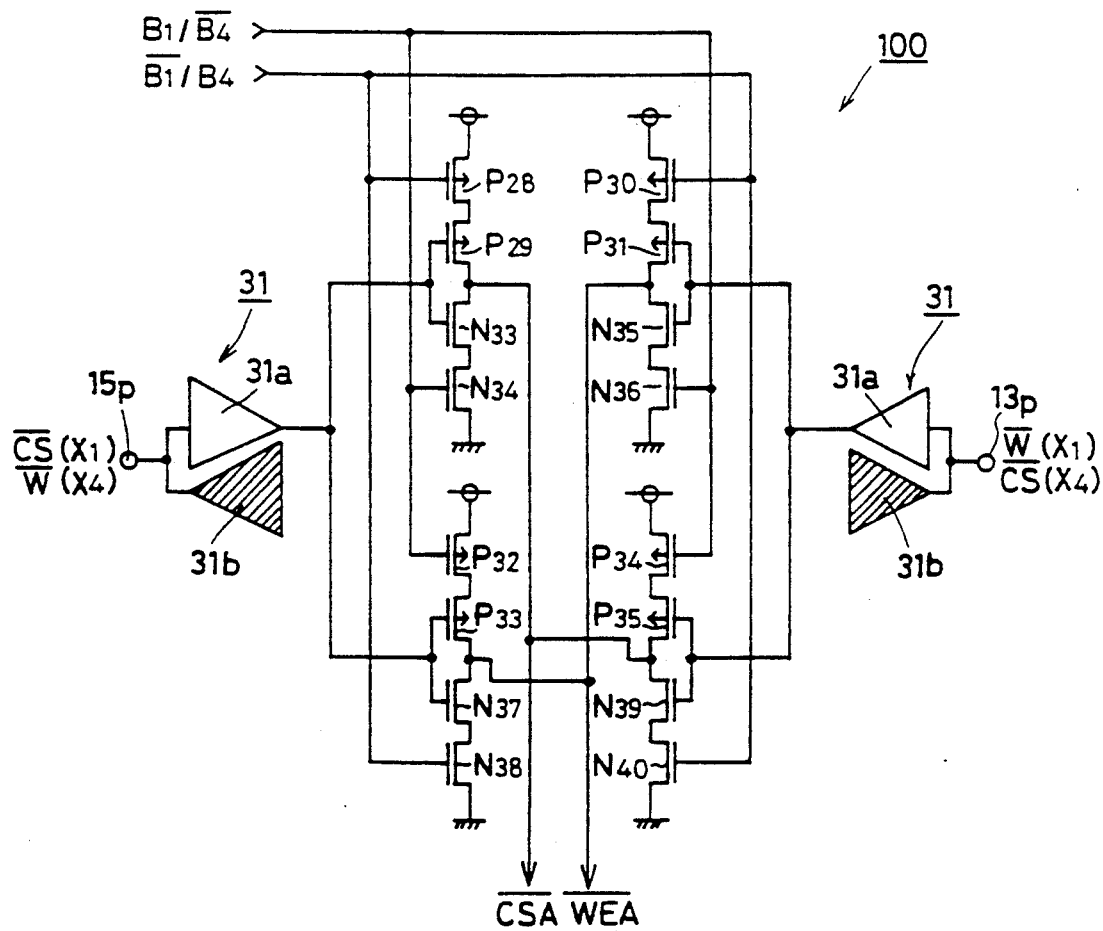
FIG. 9 is a circuit diagram of the CS/W switching circuit of FIG. 4.

FIG. 9 is a circuit diagram of a CS/W switching circuit 100 of FIG. 4.

The CS/W switching circuit 100 comprises n channel transistors N33-N40, and four clocked CMOS gates constituted by p channel transistors P28-P35.

When the switching signal B1/$\overline{B4}$ is at the "H" level, and the inverted switching signal $\overline{B1}$/B4 is at the "L" level, transistors N34, N36, P28, and P30 are turned on, while transistors N38, N40, P32, and P34 are turned off. This causes the signal applied from pad 15p to be provided as a chip select signal $\overline{CSA}$, and the signal applied from pad 13p is provided as a writing control signal $\overline{WEA}$.

On the contrary, when the switching signal B1/$\overline{B4}$ is at the "L" level, and the inverted switching signal $\overline{B1}$/B4 is at the "H" level, transistors N34, N36, P28, and P30 are turned off, while transistors N38, N40, P32, and P34 are turned on. Therefore, the signal applied from pad 15p is provided as a writing control signal $\overline{WEA}$, and the signal applied from pad 13p is provided as a chip select signal $\overline{CSA}$.

In accordance with the CS/W switching circuit of FIG. 9, the chip select signal $\overline{CSA}$ and the writing control signal $\overline{WEA}$ may be provided at the same timing even when the word organization is changed.

Figure 10:
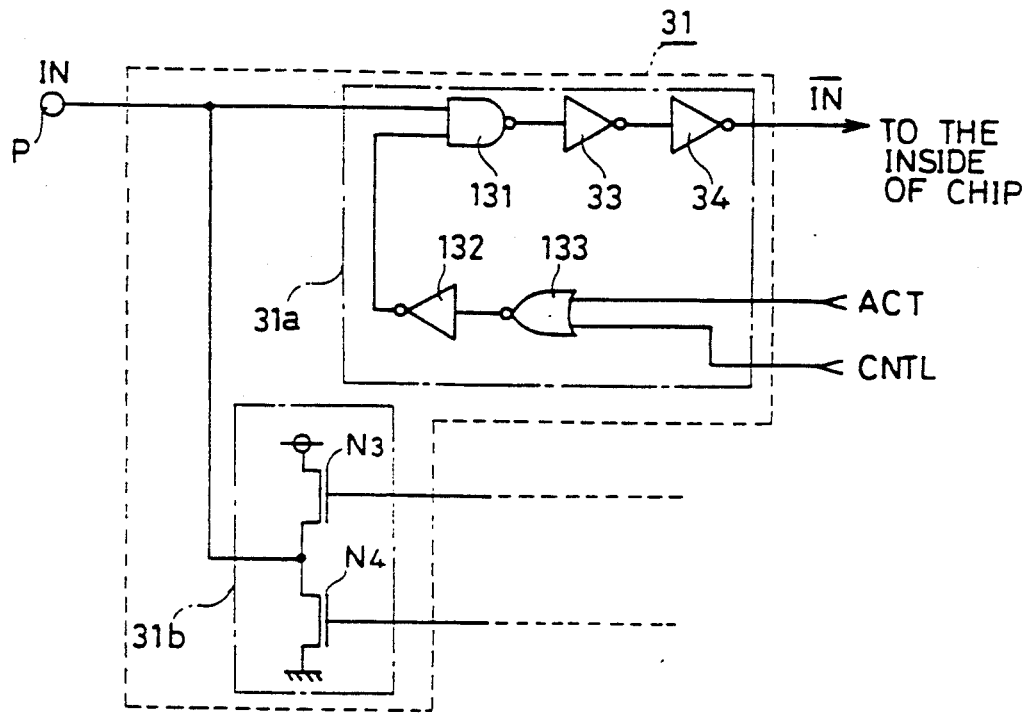
FIG. 10 is a circuit diagram of another example of the structure of an input/output buffer.

FIG. 10 is a circuit diagram showing another example of a structure of input/output buffer 31.

In FIG. 10, input buffer portion 31a comprises NAND circuit 131, inverters 33, 34, 132, and a NOR circuit 133.

When the activation signal ACT is at the "H" level, the buffer output $\overline{IN}$ changes in response to the input signal applied to pad P.

When the activation signal ACT is at the "L" level, a control signal CNTL is transferred to one input terminal of NAND circuit 131. When the control signal CNTL is at the "H" level, the buffer output $\overline{IN}$ changes in response to the input signal IN. When the control signal CNTL is at the "L" level, the buffer output $\overline{IN}$ is fixed to the "H" level.

Figure 11:
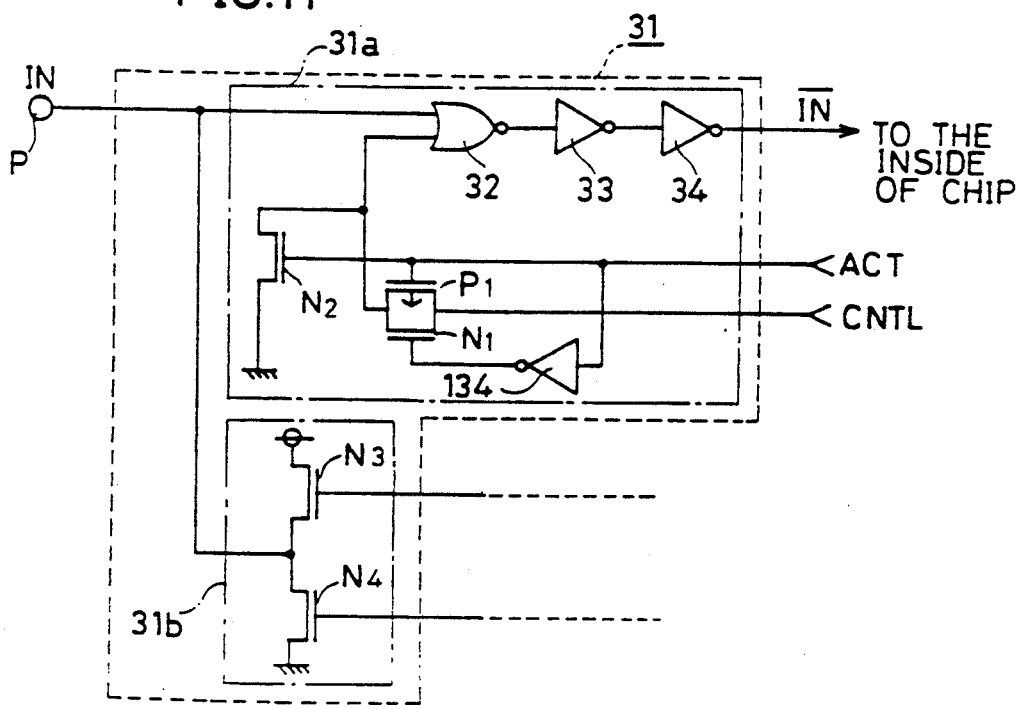
FIG. 11 is a circuit diagram of a further example of the input/output buffer.

FIG. 11 is a circuit diagram showing another example of the structure of input/output buffer 31.

The input/output buffer 31 of FIG. 11 differs from the input/output buffer 31 of FIG. 3 in that an inverter 134 is provided and the inverted activation signal $\overline{ACT}$ is not applied. The inverted signal of the activation signal ACT is applied to the gate of n channel transistor N1. The operation of input/output buffer 31 of FIG. 11 is similar to that of input/output buffer 31 of FIG. 3.

Figure 12:
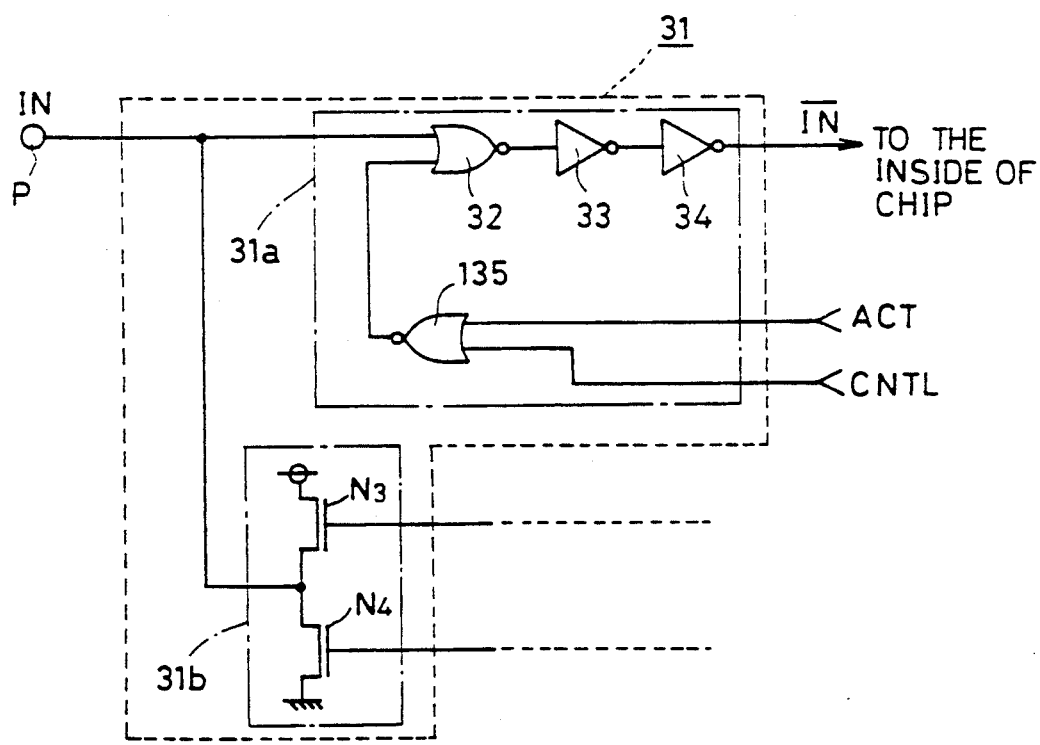
FIG. 12 is a circuit diagram of a still further example of the input/output buffer.
Figure 13:
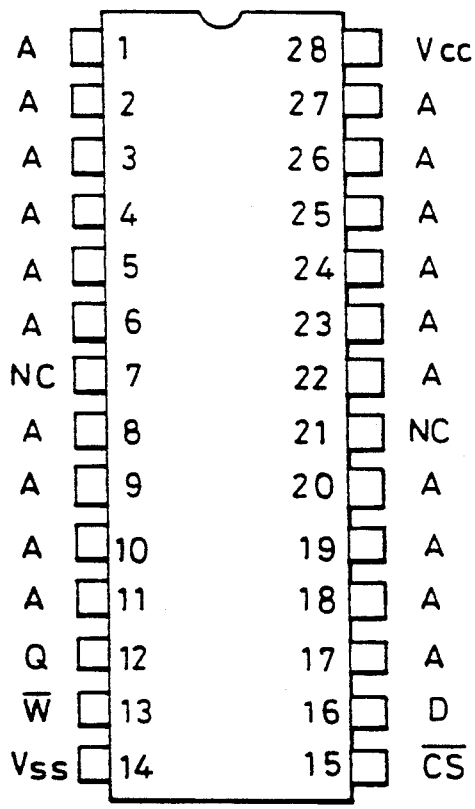
FIG. 13 is a diagram showing the pin arrangements of the semiconductor memory device of a conventional 1M word ×1 bit organization.
Figure 14:
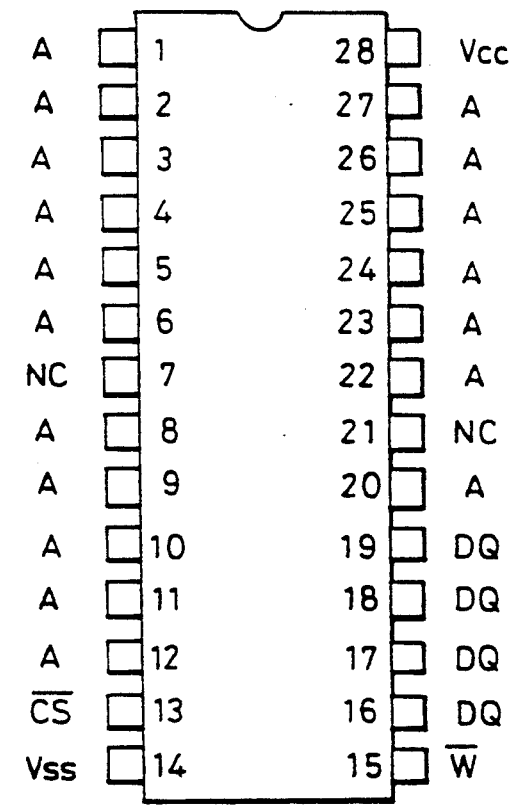
FIG. 14 is a diagram showing the pin arrangements of the semiconductor memory device of a conventional 256K word×4 bit organization.
Figure 16:
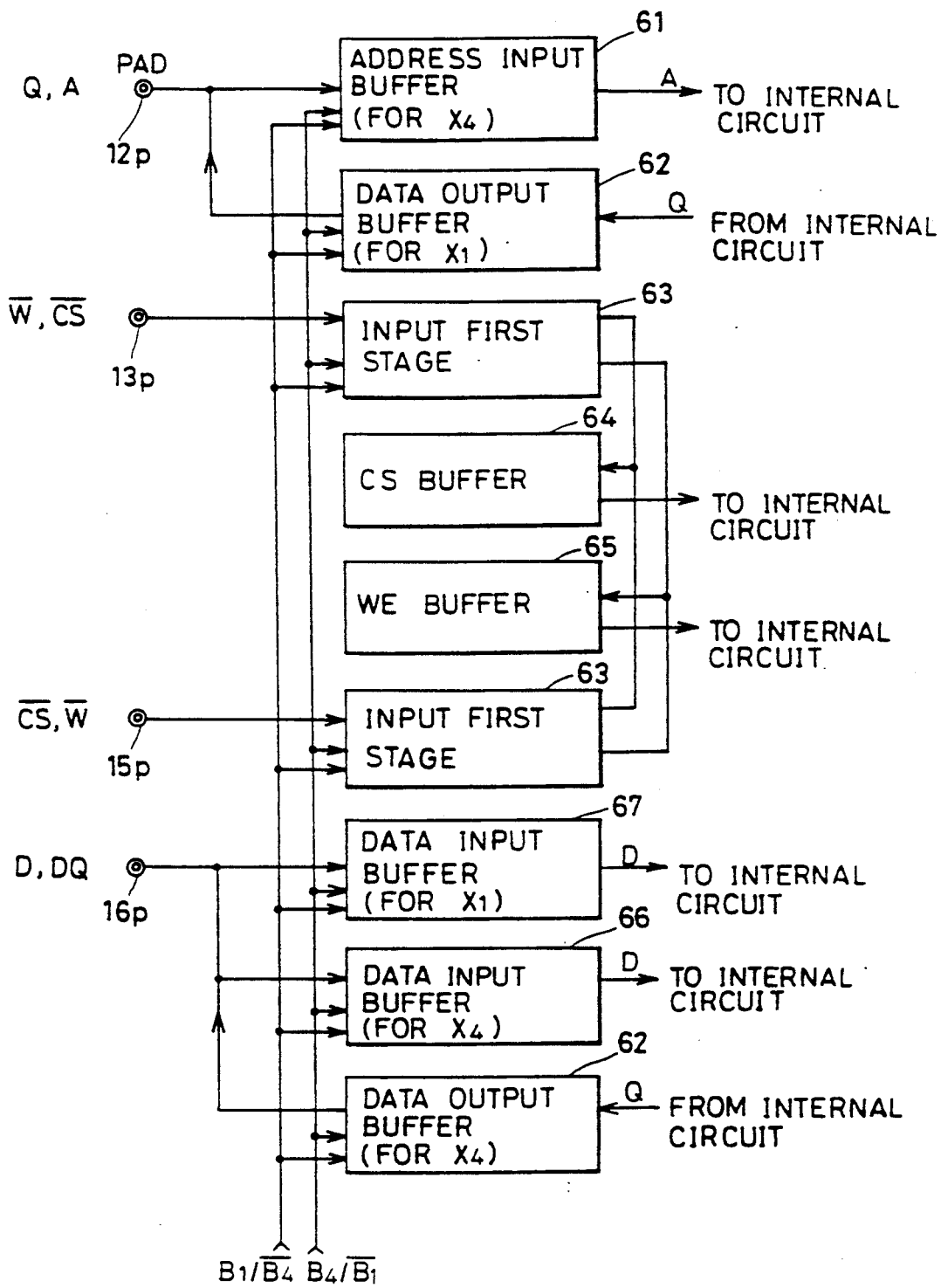
FIG. 16 is a block diagram for showing the means for switching the functions of the pins of FIG. 15.
Figure 17:
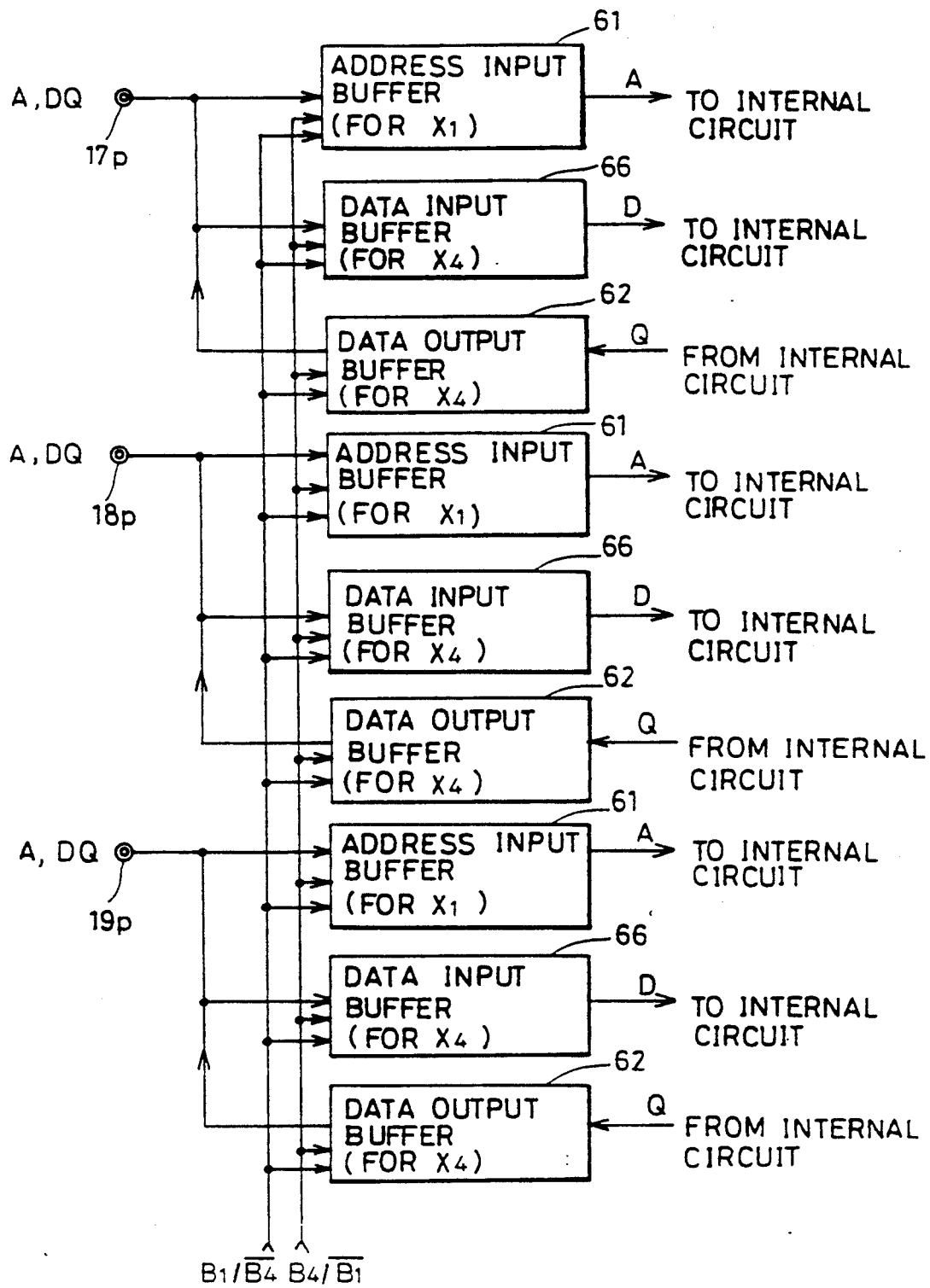
FIG. 17 is a block diagram showing the means for switching the functions of the other pins of FIG. 15.
Figure 18:
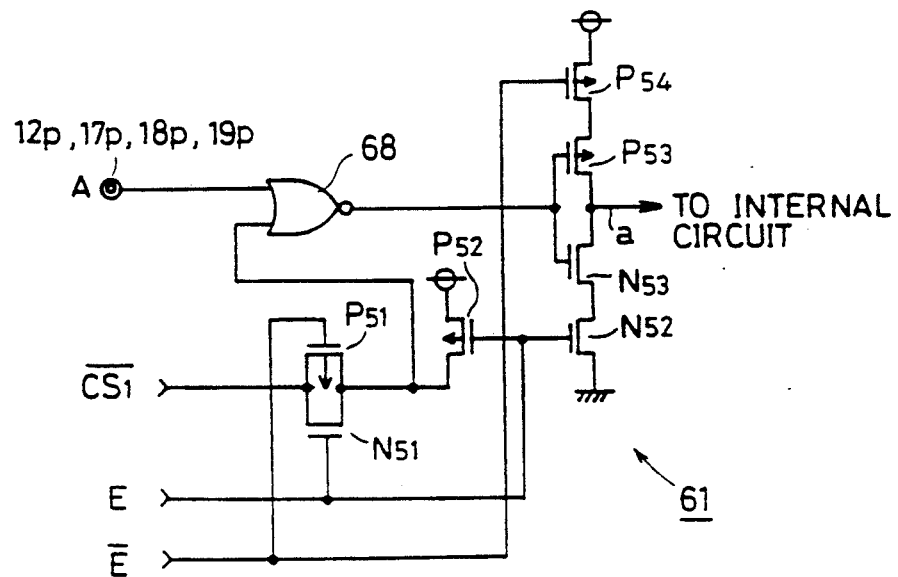
FIG. 18 is a circuit diagram of the address input buffer of FIGS. 16 and 17.
Figure 19:
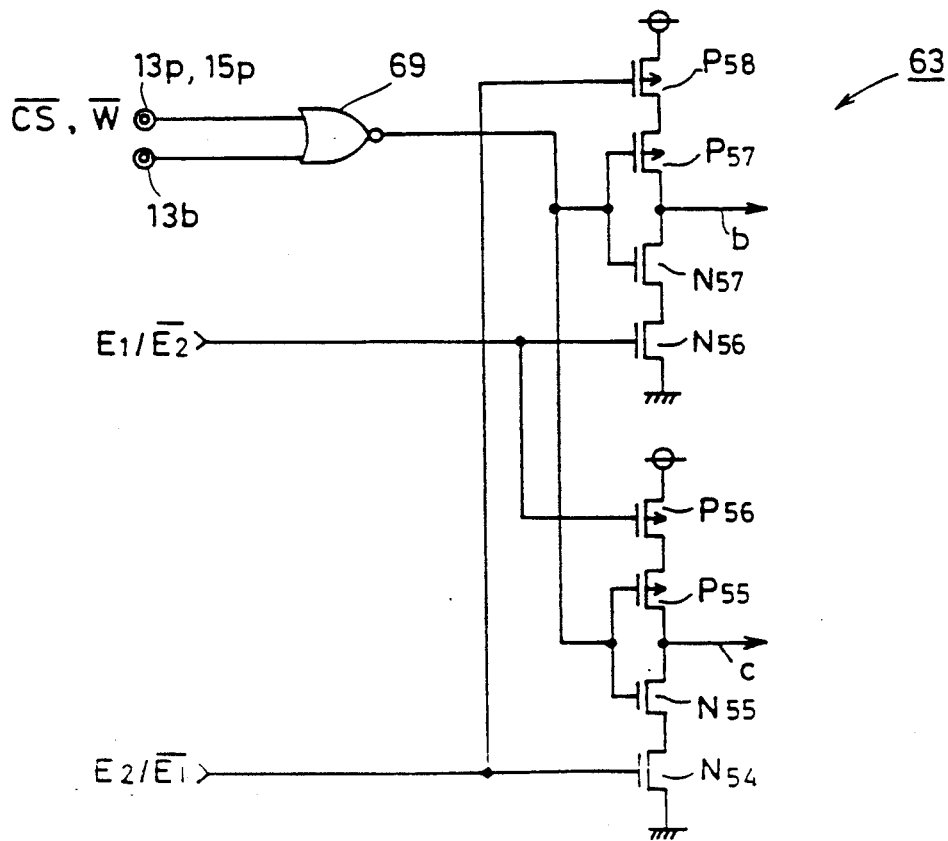
FIG. 19 is a circuit diagram of an input first stage of FIG. 16.
Figure 20:
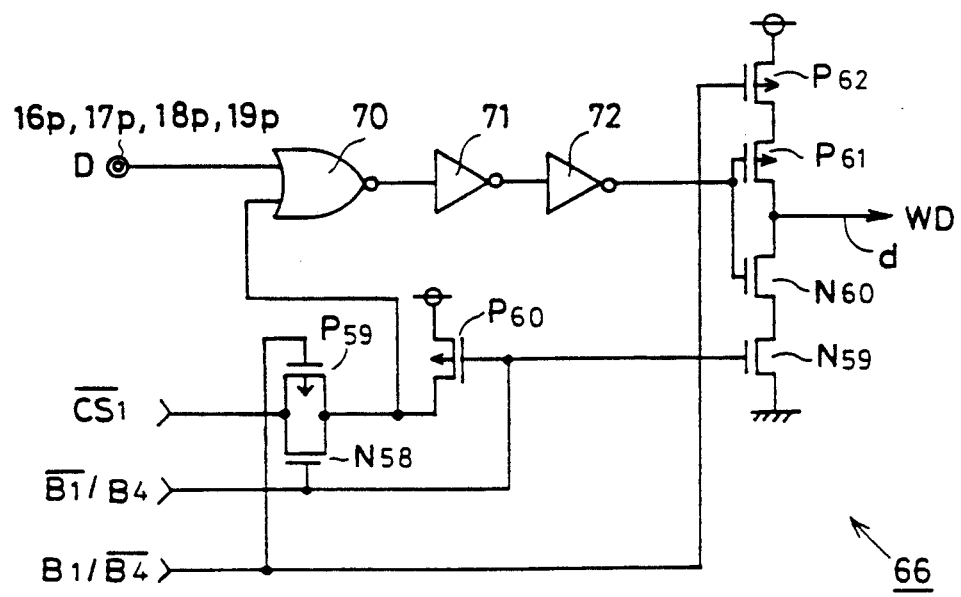
FIG. 20 is a circuit diagram of a ×4 organization data input buffer of FIGS. 16 and 17.
Figure 21:
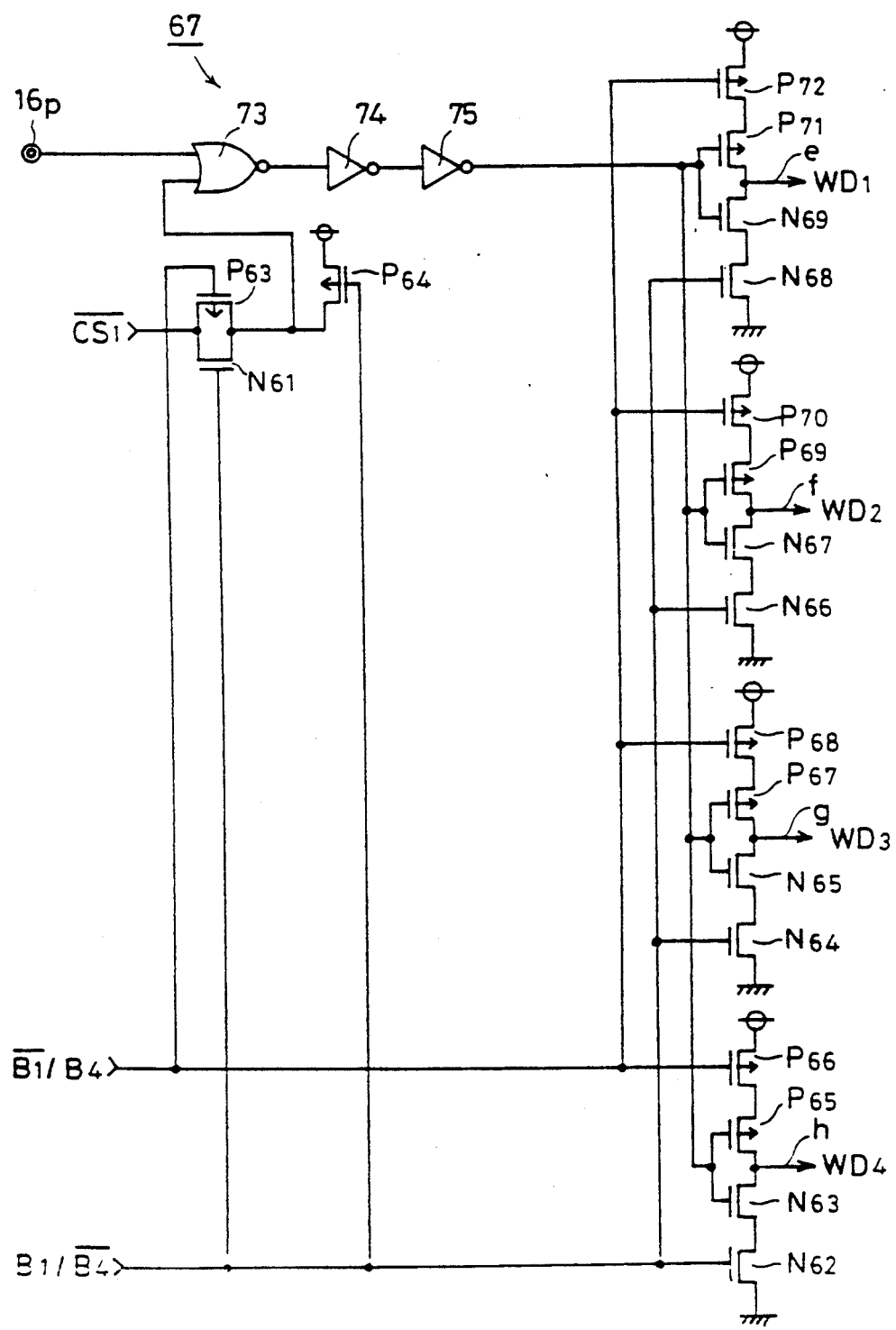
FIG. 21 is a circuit diagram of a ×1 organization data input buffer of FIG. 16.
Figure 23:
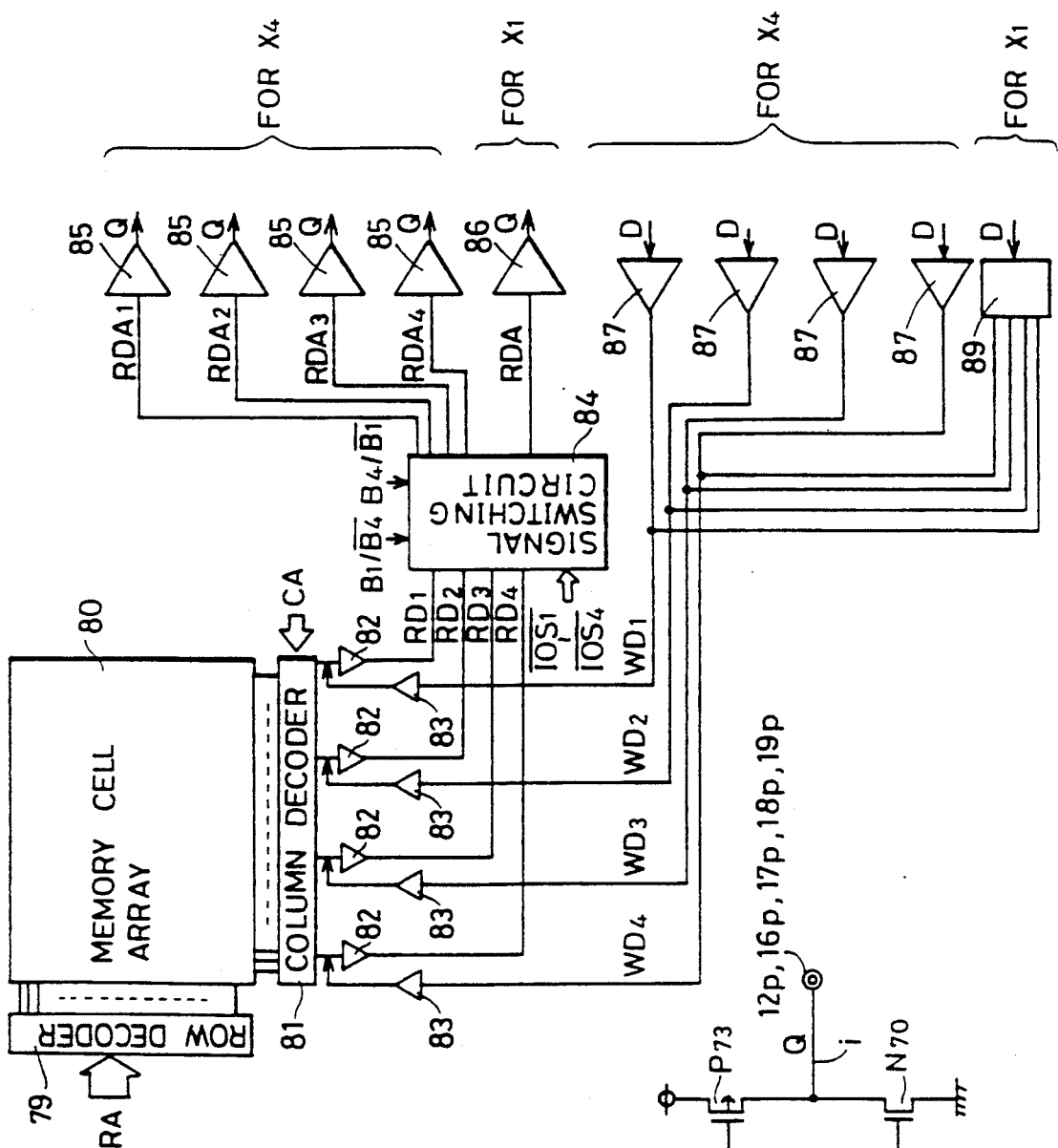
FIG. 23 is a block diagram showing the structure of the internal circuit of the semiconductor memory device of FIG. 15.
Figure 22:
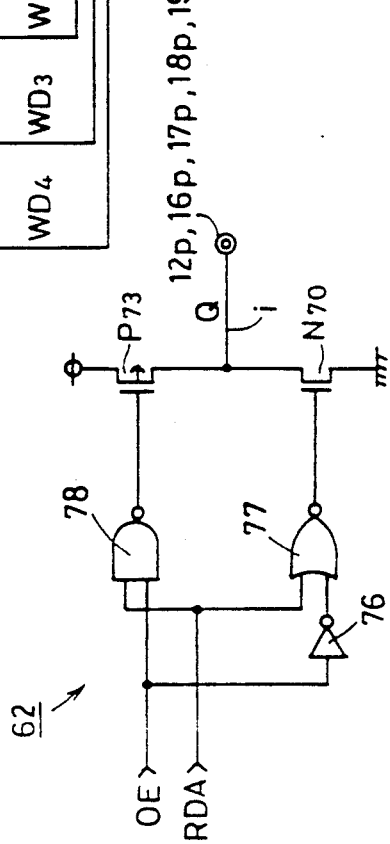
FIG. 22 is a circuit diagram of the data output buffer of FIGS. 16 and 17.
Figure 24:
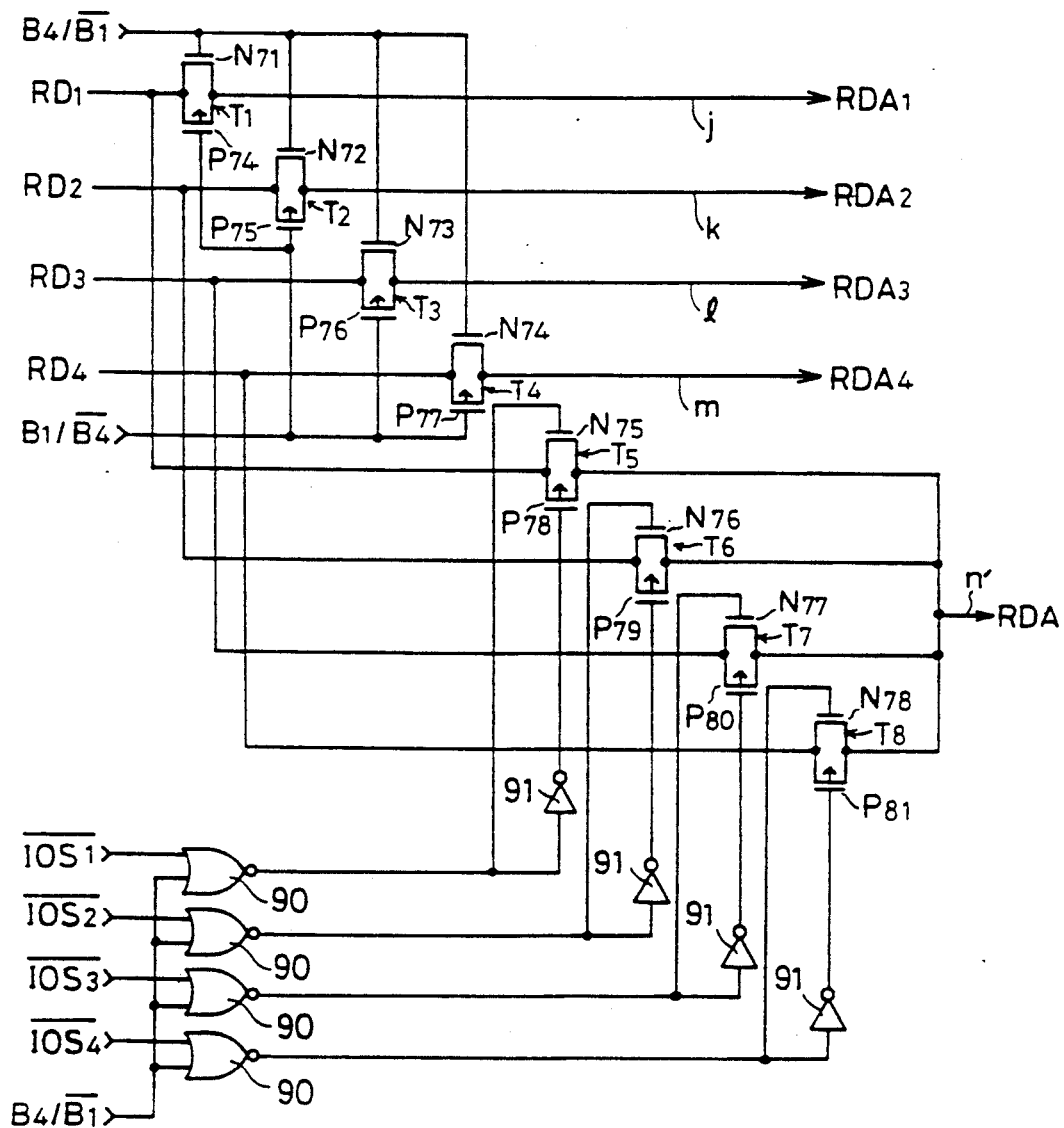
FIG. 24 is a circuit diagram of the signal switching circuit of FIG. 23.
Figure 25:
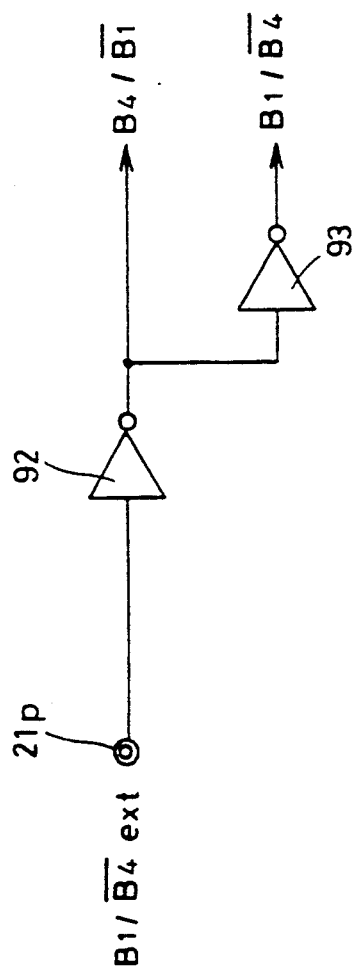
FIG. 25 is a circuit diagram showing an example of a switching signal generating circuit.

FIG. 12 is a circuit diagram of still another example of a structure of the input/output buffer.

The input/output buffer 31 of FIG. 12 differs from the input/output buffer 31 of FIG. 3 in that a NOR circuit 135 is provided instead of the transistor of input buffer portion 31a. The operation of input/output buffer 31 of FIG. 12 is similar to that of the input/output buffer of FIG. 3.

In accordance with the embodiment of the semiconductor memory device, signals transferred via identical structures of pins, pads and input/output buffers are further transferred by the same timing. Therefore, even when the pins having respective signals applied are changed in the case where a semiconductor memory device set and used under the ×1 organization is tested under the ×4 organization, the input capacitance and the output capacitance will not change. Furthermore, even when the word organization is switched, there is little change in the transfer step of the signal. This gives the advantage that the characteristics of the device such as access time do not change.

According to this embodiment, since the output buffer portion 31b included in the input/output buffer 31 connected to each pin serves as an input protection circuit, a particular exclusive circuit for input protection is not necessary.

Figure 3C:
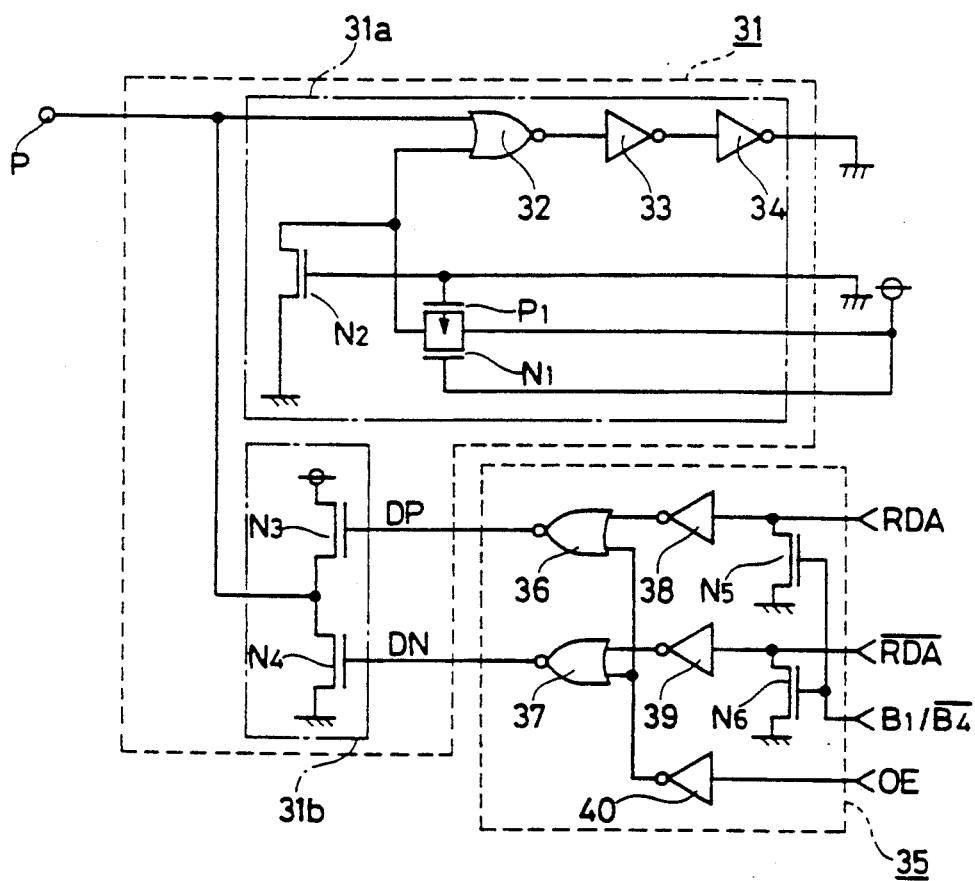
FIG. 3C is a circuit diagram showing the structure of an input/output buffer used only for output of signals.

In a semiconductor memory device having a terminal used only for signal output, an input/output buffer shown in FIG. 3C is used.

The structure and layout of the input/output buffer 31 shown in FIG. 3C are identical to those of the input/output buffer shown in FIG. 3A, except for the following points. The gates of the transistors P1 and N2 are connected to the ground terminal. The gate of the transistor N1 is connected to the power supply terminal. An input node for a control signal is connected to the power supply terminal without receiving the control signal. The output terminal of the inverter 34 is connected to the ground terminal.

It should be appreciated that although two devices with different word organizations are envisaged to be mounted on a package with identical number of pins in the above embodiment, a likewise result is obtained at the testing stage prior to assembly even when the number of pins differ.

Although a semiconductor memory device changeable between a ×1 organization and a ×4 organization has been described in the above embodiment, the present invention is not limited to the aforementioned organization, and is applicable to semiconductor memory devices changeable between a ×8 organization and a ×9 organization, or changeable between a ×1 organization, a ×4 organization, and a ×8 organization, for example, to obtain a likewise effect of the above embodiment.

It is understood that the present invention is applicable to RAMs of other memory capacitance to obtain a likewise effect, even though a RAM of 1M bit is described in the above embodiment.

Furthermore, although a static RAM is described in the above embodiment, the present invention is not limited to a static RAM, and is applicable to other memory devices, such as dynamic RAMs, ROMs to obtain a likewise effect.

It is also understood that the present invention is not limited to semiconductor memory devices, and is applicable to other semiconductor integrated circuit devices formed on the same semiconductor chip to carry out a predetermined signal processing.

Thus, in accordance with the present invention, there is no variation in the input/output capacitance per terminal, without skew occurring between signals. It is possible to increase the operating speed of the system and improve the performance of the system.

Furthermore, the word organization is changeable by switching signals without the characteristics of the device changing even when the word organization is switched. This allows a reduction in testing time, in addition to high-precision testing.

Also, a particular exclusive circuit for input protection is not necessary because the output buffer included in the input/output buffer serves as an input protection circuit. This gives advantages in the layout of the semiconductor integrated circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    a plurality of terminals comprising first terminals used for both signal input and signal output and second terminals used only for signal input,
    a plurality of input/output buffer means each connected to a respective one of said first and second terminals, each of said input/output buffer means having substantially the same input capacitance,
    each of said plurality of input/output buffer means including input buffer means and output buffer means, and
    internal circuit means coupled to said plurality of input/output buffer means to carry out predetermined signal processing.

2. A semiconductor integrated circuit device comprising:
    a plurality of terminals including (i) first terminals used for both signal input and signal output and (ii) second terminals used only for signal input;
    a plurality of input/output buffer means each connected to a respective one of said first and second terminals, each of said input/output buffer means having substantially the same input capacitance,
    each of said plurality of input/output buffer means includes input buffer means and output buffer means;
    internal circuit means coupled to said plurality of input/output buffer means to carry out predetermined signal processing;
    output driver means for activating each output buffer means connected to said first terminal; and
    disabling means for disabling each output buffer means connected to said second terminal by applying a predetermined potential.

3. A semiconductor integrated circuit device comprising:
    a plurality of terminals including (i) first terminals used for both signal input and signal output and (ii) second terminals used only for signal input;

a plurality of input/output buffer means each connected to a respective one of said first and second terminals, each of said input/output buffer means having substantially the same input capacitance, each of said plurality of input/output buffer means includes input buffer means and output buffer means, said input buffer means including circuit means for receiving data or an address signal and control signal applying means responsive to a predetermined activation signal to apply a control signal to said circuit means for passing said received data or address signal; and internal circuit means coupled to said plurality of input/output buffer means to carry out predetermined signal processing.

4. The semiconductor integrated circuit device according to claim 3, wherein said control signal applying means comprises first switching means having a first terminal for receiving said control signal, a second terminal connected to said circuit means, and a control terminal for receiving said activation signal, and second switching means coupled between said second terminal of said first switching means and a predetermined potential, and having a control terminal for receiving said activation signal.

5. The semiconductor integrated circuit device according to claim 4, wherein said first switching means comprises a MOS transistor and said second switching means comprises a transfer gate.

6. The semiconductor integrated circuit device according to claim 3, wherein said control signal applying means comprises gate circuit means for performing logical operation on said activation signal and said control signal.

7. A semiconductor circuit device comprising:

a plurality of terminals including (i) first terminals used for both signal input and signal output and (ii) second terminals used only for signal input;

a plurality of input/output buffer means each connected to a respective one of said first and second terminals, each of said input/output buffer means having substantially the same input capacitance, each of said plurality of input/output buffer means includes input buffer means and output buffer means, said output buffer means including (i) a first transistor coupled between a predetermined first potential and a corresponding one of said plurality of terminals, and (ii) a second transistor coupled between a predetermined second potential and said corresponding terminal; and internal circuit means coupled to said plurality of input/output buffer means to carry out predetermined signal processing.

8. A semiconductor integrated circuit device comprising:

a plurality of terminals comprising first terminals used for both signal input and signal output and second terminals used only for signal output, a plurality of input/output buffer means each connected to a respective one of said first and second terminals, each of said input/output buffer means having the same output capacitance, each of said plurality of input/output buffer means including input buffer means and output buffer means, and internal circuit means coupled to said plurality of input/output buffer means to carry out predetermined signal processing.

9. A semiconductor integrated circuit device comprising:

a plurality of terminals including (i) first terminals used for both signal input and signal output and (ii) second terminals used only for signal output;

a plurality of input/output buffer means each connected to a respective one of said first and second terminals, each of said input/output buffer means having substantially the same output capacitance, each of said plurality of input/output buffer means includes input buffer means and output buffer means;

internal circuit means coupled to said plurality of input/output buffer means to carry out predetermined signal processing; and output driver means for activating each output buffer means.

10. A semiconductor integrated circuit device comprising:

a plurality of terminals including (i) first terminals used for both signal input and signal output and (ii) second terminals used only for signal output;

a plurality of input/output buffer means each connected to a respective one of said first and second terminals, each of said input/output buffer means having substantially the same output capacitance, each of said plurality of input/output buffer means includes input buffer means and output buffer means, and internal circuit means coupled to said plurality of input/output buffer means to carry out predetermined signal processing, wherein said input buffer means connected to said first terminal comprises first circuit means for receiving data or an address signal and first control signal applying means responsive to a predetermined activation signal to apply a control signal to said first circuit means for passing said received data or address signal, and said input buffer means connected to said second terminal comprises second circuit means having substantially the same structure as said first circuit means and second control signal applying means having substantially the same structure as said first control signal applying means and receiving a predetermined potential in place of said activation signal.

11. A semiconductor integrated circuit device comprising:

a semiconductor chip, a plurality of memory cells formed on said semiconductor chip, a plurality of terminals formed on said semiconductor chip and receiving data and address signals, a plurality of input/output buffer means connected to said plurality of terminals, respectively, and having the same input/output capacitance, each of said plurality of input/output buffer means including input buffer means and output buffer means, first processing means formed on said semiconductor chip and coupled to predetermined input/output buffer means of said plurality of input/output buffer means, said first processing means having a first number of address input portions receiving the address signals through some of said plurality of terminals and the corresponding input/output buffer means, and a second number of data receiving portions receiving the data and being responsive to the address signals applied to said address input portions for selecting said second number of memory cells, out of said plurality of memory cells and writing the data applied to said data receiving portion to the selected memory cells or reading out the data stored in the selected memory cells to said data receiving portions, second processing means formed on said semiconductor chip and coupled to predetermined input/output buffer means of said plurality of input/output buffer means, said second processing means having a third number of address input portions receiving the address signals through some of said plurality of terminals and the corresponding input/output buffer means, and a fourth number of data receiving portions receiving the data and being responsive to the address signals applied to said address input portions for selecting said fourth number of memory cells, out of said plurality of memory cells and writing the data applied to said receiving portions to the selected memory cells or reading out the data stored in the selected memory cells to said data receiving portions, switching signal generating means formed on said semiconductor chip for generating a switching signal, and signal switching means formed on said semiconductor chip and responsive to a first state of said switching signal generated by said switching signal generating means for coupling said address input portions and said data receiving portions in said first processing means to predetermined terminals, out of said plurality of terminals, through the corresponding input/output buffer means and responsive to a second state of said switching signal generated by said switching signal generating means for coupling said address input portions and said data receiving portion in said second processing means to a predetermined terminal, out of said plurality of terminals through the corresponding input/output buffer means.

12. The semiconductor integrated circuit device according to claim 11, wherein said plurality of terminals comprise first terminals used for both signal input and signal output and second terminals used only for signal input, each of said plurality of input/output buffer means is connected to a respective one of said first and second terminals, each of said input/output buffer means has the same input capacitance, and each of said plurality of input/output buffer means includes input buffer means and output buffer means.

13. The semiconductor integrated circuit device according to claim 12, further comprising output driver means for activating each output buffer means connected to said first terminal, and disabling means for disabling each output buffer means connected to said second terminal by applying a predetermined potential.

14. The semiconductor integrated circuit device according to claim 12, wherein said input buffer means comprises circuit means for receiving data or address signal and control signal applying means responsive to a predetermined activation signal to apply a control signal to said circuit means for passing said received data or address signal.

15. The semiconductor integrated circuit device according to claim 14, wherein said control signal applying means comprises first switching means having a first terminal for receiving said control signal, a second terminal connected to said circuit means, and a control terminal for receiving said activation signal, and second switching means coupled between said second terminal of said first switching means and a predetermined potential and having a control terminal for receiving said activation signal.

16. The semiconductor integrated circuit device according to claim 15, wherein said first switching means comprises a MOS transistor and said second switching means comprises a transfer gate.

17. The semiconductor integrated circuit device according to claim 14, wherein said control signal applying means comprises gate circuit means for performing logical operation on said activation signal and said control signal.

18. The semiconductor integrated circuit device according to claim 12, wherein said output buffer means comprises a first transistor coupled between a predetermined first potential and a corresponding one of said plurality of terminals, and or coupled between a predetermined second potential and said corresponding terminal.

19. The semiconductor integrated circuit device according to claim 11, wherein said plurality of terminals comprise first terminals used for both signal input and signal output and second terminals used only for signal output, each of said plurality of input/output buffer means is connected to a respective one of said first and second terminals, each of said input/output buffer means has the same output capacitance, and each of said plurality of input/output buffer means includes input buffer means and output buffer means.

20. The semiconductor integrated circuit device according to claim 19, further comprising output driver means for activating each output buffer means.

21. The semiconductor integrated circuit device according to claim 19, wherein said input buffer means connected to said first terminal comprises first circuit means for receiving data or addresses signal and first control signal applying means responsive to a predetermined activation signal to apply a control signal to said circuit means for passing said received data or address signal, and said input buffer means connected to said second terminal comprises second circuit means having the same structure as said first circuit means and second control signal applying means having the same structure as said first control signal applying means and receiving a predetermined potential in place of said activation signal.

22. The semiconductor integrated circuit device according to claim 11, wherein said switching signal generating means comprises switching terminal formed on said semiconductor chip to receive an external switching signal, and switching signal input/output buffer means connected to said switching terminal and having an input/output capacitance identical to that of other input/output buffer means.

23. On a single chip, a semiconductor integrated circuit device for a random access memory operable in two or more alternative configurations, comprising:

a plurality of memory cells;

a predetermined number of input/output terminals, said input/output terminals comprising a first set of terminals having set of terminals having the same function for each of said configurations and second set of terminals having different functions in different configurations;

a plurality of buffer circuits, each comprising an input buffer circuit portion and an output buffer circuit portion connected to one of said input/output terminals, the input/output capacitance of all of said buffer circuits being the same;

conditioning means responsive to an external signal, indicative of a selected configuration, for conditioning said plurality of buffer circuits for operation in accordance with the functions of said input/output terminals in the selected configuration.

24. The semiconductor integrated circuit device as recited in claim 23, wherein the functions of said input/output terminals comprise input signal transmission and output signal transmission and said conditioning means comprises first means for conditioning the input buffer circuit portions associated with terminals performing input signal transmission, and second means for conditioning the output buffer circuit portions associated with terminals performing output signal transmission.

25. A semiconductor integrated circuit device comprising:

and output terminal for receiving an input signal and outputting an output signal;

an input terminal for receiving an input signal;

a first buffer circuit comprising first and second circuits, an input node of said first circuit connected to said input and output terminal, an output node of said first circuit connected to an input node of an internal circuit, an input node of said second circuit connected to an output node of said internal circuit, an output node of said second circuit connected to said input and output terminal; and a second buffer circuit comprising third and fourth circuits, the structure of said third circuit being the same as the structure of said first circuit, the structure of said fourth circuit being the same as the structure of said second circuit, an input node of said third circuit connected to said input terminal, an output node of said third circuit connected to an input node of said internal circuit, and an output node of said fourth circuit connected to said input terminal.

26. A semiconductor integrated circuit device comprising:

an input and output terminal for receiving an input signal and outputting an output signal;

an output terminal for outputting an output signal;

a first buffer circuit comprising first and second circuits, an input node of said first circuit connected to said input and output terminal, an output node of said first circuit connected to an input node of an internal circuit, an input node of said second circuit connected to an output node of said internal circuit, an output node of said second circuit connected to said input and output terminal; and a second buffer circuit comprising third and fourth circuits, the structure of said third circuit being the same as the structure of said first circuit, the structure of said fourth circuit being the same as the structure of said second circuit, an input node of said third circuit connected to said output terminal, an input node of said fourth circuit connected to an output node of said internal circuit, and an output node of said fourth circuit connected to said output terminal.

27. A semiconductor integrated circuit device comprising:

a plurality of terminals including (i) first bonding pads used for both signal input and signal output and (ii) second bonded pads used only for signal input;

a plurality of input/output buffer means each permanently connected to a respective one of said first and second bonding pads, each of said input/output buffer means having substantially the same input capacitance, each of said plurality of input/output buffer means includes input buffer means and output buffer means, and internal circuit means coupled to said plurality of input/output buffer means for performing predetermined signal processing.

28. A semiconductor integrated circuit device comprising:

a plurality of terminals including (i) first bonding pads used for both signal input and signal output and (ii) second bonded pads used only for signal output;

a plurality of input/output buffer means each permanently connected to a respective one of said first and second bonding pads, each of said input/output buffer means having substantially the same output capacitance, each of said plurality of input/output buffer means includes input buffer means and output buffer means, and internal circuit means coupled to said plurality of input/output buffer means for performing predetermined signal processing.

* * * * *